United States Patent
Hashimoto et al.

(10) Patent No.: US 10,207,474 B2
(45) Date of Patent: Feb. 19, 2019

(54) MULTILAYER FILM, OPTICALLY ANISOTROPIC LAYERED BODY, CIRCULARLY POLARIZING PLATE, ORGANIC ELECTROLUMINESCENCE DISPLAY DEVICE, AND MANUFACTURING METHOD

(71) Applicant: ZEON CORPORATION, Chiyoda-ku, Tokyo (JP)

(72) Inventors: Hiromasa Hashimoto, Tokyo (JP); Masakazu Saito, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 15/541,479

(22) PCT Filed: Jan. 20, 2016

(86) PCT No.: PCT/JP2016/051608
§ 371 (c)(1),
(2) Date: Jul. 4, 2017

(87) PCT Pub. No.: WO2016/121602
PCT Pub. Date: Aug. 4, 2016

(65) Prior Publication Data
US 2017/0368793 A1     Dec. 28, 2017

(30) Foreign Application Priority Data
Jan. 28, 2015   (JP) ................................. 2015-014765

(51) Int. Cl.
G02F 1/13363     (2006.01)
B32B 7/02        (2006.01)
(Continued)

(52) U.S. Cl.
CPC .............. *B32B 7/02* (2013.01); *G02B 5/3016* (2013.01); *G02F 1/13363* (2013.01);
(Continued)

(58) Field of Classification Search
CPC ................. G02F 1/13363; G02F 2001/133638
See application file for complete search history.

(56) References Cited

U.S. PATENT DOCUMENTS

| | | |
|---|---|---|
| 5,132,147 A | 7/1992 | Takiguchi et al. |
| 5,833,880 A | 11/1998 | Siemensmeyer et al. |

(Continued)

FOREIGN PATENT DOCUMENTS

| | | |
|---|---|---|
| EP | 0525478 A2 | 2/1993 |
| EP | 1452892 A1 | 9/2004 |

(Continued)

OTHER PUBLICATIONS

Aug. 1, 2017, International Preliminary Report on Patentability issued in the International Patent Application No. PCT/JP2016/051608.

(Continued)

*Primary Examiner* — Kendrick Hsu
(74) *Attorney, Agent, or Firm* — Kenja IP Law PC

(57) ABSTRACT

A multilayer film including: a first long-length substrate; and an optically anisotropic layer that is formed directly on the first substrate and contains cured liquid crystal molecules, wherein the first substrate has an Nz factor of 1.1 to 3.0, variation of orientation angle of 1.0° or less, and an orientation-regulating force caused by stretching, and an angle formed between a slow axis of the first substrate and a widthwise direction of the first substrate is 0° or more and less than 90°; and manufacturing method and use thereof.

15 Claims, 1 Drawing Sheet

(51) Int. Cl.
*G02B 5/30* (2006.01)
*H01L 51/52* (2006.01)

(52) U.S. Cl.
CPC ...... *H01L 51/5281* (2013.01); *H01L 51/5293* (2013.01); *G02F 2001/133638* (2013.01)

(56) References Cited

U.S. PATENT DOCUMENTS

| | | | |
|---|---|---|---|
| 6,215,539 | B1 | 4/2001 | Schadt et al. |
| 6,300,991 | B1 | 10/2001 | Schadt et al. |
| 6,699,405 | B2 | 3/2004 | Prechtl et al. |
| 6,793,986 | B2 | 9/2004 | Prechtl et al. |
| 7,411,645 | B2 | 8/2008 | Kashima |
| 7,754,912 | B2 | 7/2010 | Irisawa et al. |
| 7,771,616 | B2 | 8/2010 | Irisawa et al. |
| 9,207,360 | B2 | 12/2015 | Sakamoto et al. |
| 2004/0189909 | A1 | 9/2004 | Kashima |
| 2007/0165165 | A1* | 7/2007 | Joten ............. G02F 1/133528 349/119 |
| 2008/0180619 | A1 | 7/2008 | Kashima |
| 2013/0140587 | A1* | 6/2013 | Lim ................ H01L 51/5281 257/88 |
| 2015/0343725 | A1 | 12/2015 | Matsuda et al. |
| 2016/0145363 | A1 | 5/2016 | Sakamoto et al. |

FOREIGN PATENT DOCUMENTS

| | | |
|---|---|---|
| JP | H039325 A | 1/1991 |
| JP | H0416919 A | 1/1992 |
| JP | H0850206 A | 2/1996 |
| JP | H08160430 A | 6/1996 |
| JP | H1152131 A | 2/1999 |
| JP | H11153712 A | 6/1999 |
| JP | 2980558 B2 | 11/1999 |
| JP | H11513360 A | 11/1999 |
| JP | 2000267105 A | 9/2000 |
| JP | 2002006322 A | 1/2002 |
| JP | 2002030042 A | 1/2002 |
| JP | 2002321302 A | 11/2002 |
| JP | 2003177242 A | 6/2003 |
| JP | 2003207641 A | 7/2003 |
| JP | 2004204190 A | 7/2004 |
| JP | 2005263789 A | 9/2005 |
| JP | 2007119415 A | 5/2007 |
| JP | 2007186430 A | 7/2007 |
| JP | 2014139661 A | 7/2014 |
| WO | 2009025170 A1 | 2/2009 |
| WO | 2012147904 A1 | 11/2012 |

OTHER PUBLICATIONS

Apr. 26, 2016, International Search Report issued in the International Patent Application No. PCT/JP2016/051608.
C. Destrade et al., Disc-Like Mesogens: A Classification, Molecular Crystals and Liquid Crystals, 1981, vol. 71, Issue 1-2, pp. 111-135.
Journal of technical disclosure No. 2001-1745, Mar. 15, 2001, Japan Institute for Promoting Invention and Innovation.
Jinshan Zhang et al., Liquid Crystals Based on Shape-Persistent Macrocyclic Mesogens, J. Am. Chem. Soc., 1994, vol. 116, p. 2655.
The Chemical Society of Japan, Chemistry of Liquid Crystal, Quarterly Chemical Review, 1994, No. 22, chapter 5 and Section 2 of Chapter 10.

* cited by examiner

MULTILAYER FILM, OPTICALLY ANISOTROPIC LAYERED BODY, CIRCULARLY POLARIZING PLATE, ORGANIC ELECTROLUMINESCENCE DISPLAY DEVICE, AND MANUFACTURING METHOD

FIELD

The present invention relates to a multilayer film and an optically anisotropic layered body that have an optically anisotropic layer. The present invention also relates to a circularly polarizing plate having the optically anisotropic layer, an organic electroluminescent display device, and a manufacturing method.

BACKGROUND

A phase difference plate is widely used as a component of a display device, such as a liquid crystal display device and an organic electroluminescent (hereinafter sometimes referred to as "organic EL") display device. A phase difference plate used in the display device may be required to uniformly express a desired phase difference of λ/4, λ/2, or the like over the entire wavelength region for display (usually visible region), thereby exerting the effect over the entire wavelength region for display.

If it is possible that such a phase difference plate as a long-length film having a desired width is continuously manufactured in a manufacturing line and a phase difference plate having a rectangular shape that corresponds to a rectangular display surface of a display device is cut out from the resulting long-length phase difference plate, efficient manufacturing of such a phase difference plate is made possible. Furthermore, if it is possible that the cutting is performed so that sides of the rectangular phase difference plate correspond to directions close to directions parallel to the lengthwise and widthwise directions of the long-length phase difference plate, more efficient manufacturing is made possible.

The phase difference plate in the display device may be required to have a slow axis at a certain angle, such as 15°, 45°, or 75°, relative to a transmission axis of a co-used polarizing plate. For example, when a linear polarizer and a λ/4 wave plate are used in combination to express an anti-reflection function of external light, the phase difference plate is required to have a slow axis at an angle of 45° relative to a transmission axis of the linear polarizer. In many cases, polarization axes of the polarizing plate include a transmission axis in a direction parallel to the longitudinal or lateral side of a rectangular display surface of a display device. In manufacturing of the linear polarizer as a long-length film, a linear polarizer having a transmission axis in a direction parallel or perpendicular to the lengthwise direction, in particular in a direction perpendicular to the lengthwise direction, can be easily manufactured. Therefore, if it is possible that a long-length phase difference plate having a slow axis at a certain angle, such as 15°, 45°, or 75°, relative to the widthwise direction is manufactured, the manufacturing is very advantageous to manufacturing of the phase difference plate for the display device.

As one of methods for obtaining the phase difference plate, a method in which a compound capable of exhibiting a liquid crystal phase is molded into a solid film while the state of exhibiting the liquid crystal phase is kept is known. Specific examples of the method may include a method in which a composition containing a polymerizable liquid crystal compound that is polymerizable and capable of exhibiting a liquid crystal phase is applied onto a surface of an appropriate substrate to form a layer, the polymerizable compound is oriented within the layer, and the polymerizable compound is then polymerized while the oriented state is maintained, to form an optically anisotropic film. According to such a method, a phase difference plate that uniformly expresses a phase difference over the plane can be obtained. When the polymerizable liquid crystal compound is appropriately selected, a phase difference plate that causes a uniform phase difference at a visible light wavelength region can be obtained (for example, Patent Literature 1).

As the method for orienting such a compound capable of exhibiting a liquid crystal phase, a method in which an orientation-regulating force is imparted to a surface of a substrate, a composition containing a compound capable of exhibiting a liquid crystal phase is applied onto the surface and placed under conditions suitable for orientation is generally performed. Examples of the method for imparting an orientation-regulating force to a surface of a substrate may include a method through rubbing (for example, Patent Literatures 2 to 4) and a method through optical orientation (for example, Patent Literatures 5 and 6). In addition, a method of using a film to which an orientation-regulating force is imparted by a stretching treatment as a substrate to orient a liquid crystal compound on the film is known (for example, Patent Literatures 7 to 9).

CITATION LIST

Patent Literature

Patent Literature 1: Japanese Patent Application Laid-Open No. Hei. 11-52131 A
Patent Literature 2: Japanese Patent Application Laid-Open No. Hei. 08-160430 A
Patent Literature 3: Japanese Patent Application Laid-Open No. 2000-267105 A
Patent Literature 4: Japanese Patent Application Laid-Open No. 2002-6322 A
Patent Literature 5: Japanese Patent No. 2980558 B (corresponding foreign publication: European Patent Application Publication No. 0525478)
Patent Literature 6: Japanese Patent Application Laid-Open No. Hei. 11-153712 A
Patent Literature 7: Japanese Patent Application Laid-Open No. Hei. 03-9325 A (corresponding foreign publication: U.S. Pat. No. 5,132,147)
Patent Literature 8: Japanese Patent Application Laid-Open No. Hei. 04-16919 A
Patent Literature 9: Japanese Patent Application Laid-Open No. 2003-207641 A (corresponding foreign publication: European Patent Application Publication No. 1452892)

SUMMARY

Technical Problem

However, when rubbing is performed, static electricity tends to be generated during the treatment process of rubbing. Due to such generation of static electricity, a foreign substance may be attached, and orientation defects may occur, which may cause problems such as deterioration of quality of the product. When rubbing is continuously performed in a diagonal direction on a long-length substrate, that process may also cause a problem of extreme difficulty in exact control of the orientation direction. When an orientation-regulating force is imparted by optical orientation, that process may cause problems such as high cost and low processing speed.

When the orientation-regulating force is imparted to a film by a stretching treatment, it is difficult to impart sufficient orientation-regulating force. In particular, when the orientation-regulating force in a diagonal direction is imparted, it is necessary to perform stretching in the diagonal direction. In this case, it is difficult to uniformly apply sufficient orientation-regulating force with high accuracy. For this reason, in the optically anisotropic layer obtained, defects such as schlieren defects are likely to occur.

Therefore, an object of the present invention is to provide a multilayer film and an optically anisotropic layered body that have an optically anisotropic layer that can be used as a material for a phase difference plate such as a λ/2 wave plate and a λ/4 wave plate, uniformly expresses a phase difference over the plane, can be efficiently manufactured, and has a reduced number of defects due to generation of a foreign substance and insufficient orientation-regulating force, and a method for manufacturing the same.

Another object of the present invention is to provide a circularly polarizing plate and an organic electroluminescent display device that can be efficiently manufactured and have a reduced number of defects due to generation of a foreign substance and insufficient orientation-regulating force.

Solution to Problem

The present inventor has conducted studies to solve the aforementioned problems. As a result, the inventor has conceived use of a substrate in which a slow axis in a direction different from the lengthwise direction thereof is imparted in a specific manner. The inventor has found that when an optically anisotropic layer containing cured liquid crystal molecules with orientation regularity is formed directly on such a substrate, the aforementioned problems can be solved. Thus, the present invention has been completed.

Accordingly, the present invention provides the following.

(1) A multilayer film comprising:
a first long-length substrate; and
an optically anisotropic layer that is formed directly on the first substrate and contains cured liquid crystal molecules, wherein
the first substrate has an Nz factor of 1.1 to 3.0, variation of orientation angle of 1.0° or less, and an orientation-regulating force caused by stretching, and
an angle formed between a slow axis of the first substrate and a widthwise direction of the first substrate is 0° or more and less than 90°.

(2) The multilayer film according to (1), wherein the angle formed between the slow axis of the first substrate and the widthwise direction of the first substrate is 40° to 80°.

(3) The multilayer film according to (2), wherein the angle formed between the slow axis of the first substrate and the widthwise direction of the first substrate is 55° to 80°.

(4) The multilayer film according to any one of (1) to (3), wherein the first substrate is a film of a resin having a positive intrinsic birefringence.

(5) The multilayer film according to any one of (1) to (4), wherein the first substrate is a film of a resin containing an alicyclic structure-containing polymer.

(6) The multilayer film according to any one of (1) to (5), wherein the first substrate is a stretched film obtained by a stretching step including one or more diagonal stretching processes.

(7) The multilayer film according to any one of (1) to (6), wherein the optically anisotropic layer has inverse wavelength dispersion.

(8) The multilayer film according to any one of (1) to (7), wherein the optically anisotropic layer is a λ/4 wave plate.

(9) The multilayer film according to any one of (1) to (7), wherein the optically anisotropic layer is a λ/2 wave plate.

(10) The multilayer film according to any one of (1) to (9), wherein the optically anisotropic layer has a thickness of 5 μm or less.

(11) An optically anisotropic layered body obtained by:
separating, from the multilayer film according to any one of (1) to (10), the optically anisotropic layer; and
bonding the optically anisotropic layer to a second long-length substrate.

(12) A circularly polarizing plate obtained by bonding an optically anisotropic layer to a long-length linear polarizer by a roll to roll process, wherein
the optically anisotropic layer is a layer separated from the multilayer film according to any one of (1) to (10).

(13) An organic electroluminescent display device comprising the circularly polarizing plate according to (12).

(14) A method for manufacturing the multilayer film according to any one of (1) to (10), the method comprising:
a step (I) of feeding out a first long-length substrate in a lengthwise direction, in which the first substrate has an Nz factor of 1.1 to 3.0, variation of orientation angle of 1.0° or less, and an orientation-regulating force caused by stretching, and an angle formed between the slow axis of the first substrate and the widthwise direction of the first substrate is 0° or more and less than 90°;
a step (II) of applying a liquid crystal composition containing a polymerizable liquid crystal compound directly onto a surface of the fed-out first substrate to form a layer of the liquid crystal composition;
a step (III) of orienting the polymerizable liquid crystal compound in the layer of the liquid crystal composition; and
a step (IV) of polymerizing the polymerizable liquid crystal compound to form cured liquid crystal molecules.

(15) The method for manufacturing the multilayer film according to (14), wherein an applying direction of the liquid crystal composition is different from an orientation direction of the polymerizable liquid crystal compound.

Advantageous Effects of Invention

The multilayer film and the optically anisotropic layered body of the present invention can be used as a material for a phase difference plate, such as a λ/2 wave plate and a λ/4 wave plate, can express a phase difference over the plane, can be efficiently manufactured, and can provide an optically anisotropic layer that has a reduced number of defects due to generation of a foreign substance and insufficient orientation-regulating force. According to the manufacturing method of the present invention, the multilayer film of the present invention can be efficiently manufactured.

Furthermore, when an optically anisotropic layer having inverse wavelength dispersion characteristics is formed using a polymerizable liquid crystal compound having inverse wavelength dispersion as a material for cured liquid crystal molecules, an optical material that has, all at high level, high manufacturing efficiency by diagonal stretching, high degree of design freedom of slow axis direction, uniform characteristics over the plane, a reduced number of defects due to a foreign substance, and usefulness due to inverse wavelength dispersion characteristics may be provided.

The circularly polarizing plate and the organic electroluminescent display device of the present invention can be those having uniform characteristics, can be efficiently manufactured, and have a reduced number of defects due to generation of a foreign substance and insufficient orientation-regulating force.

DESCRIPTION OF EMBODIMENTS

Figure 1:
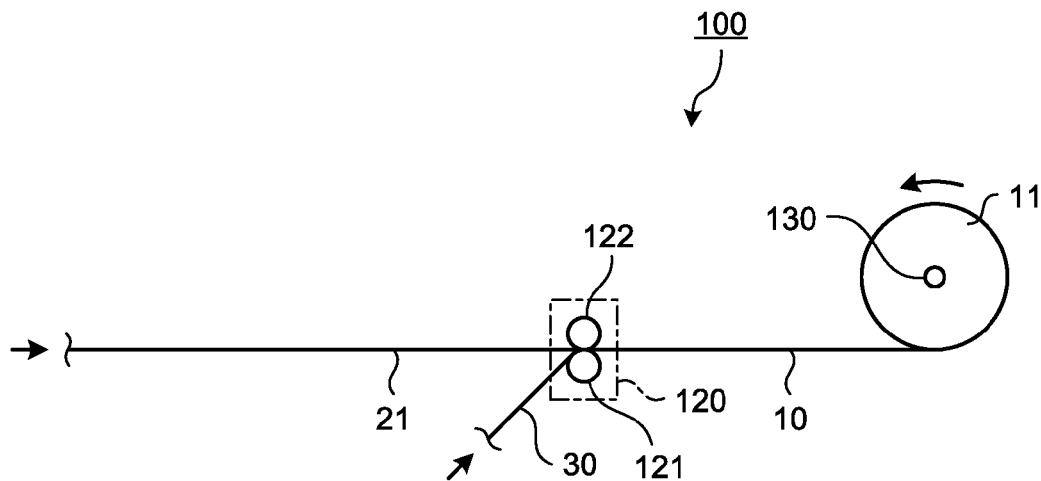
FIG. 1 is a schematic view illustrating an example of bonding by a roll to roll process.

Hereinafter, the present invention will be described in detail with reference to examples and embodiments, but the present invention is not limited to the following examples and embodiments and may be freely modified and practiced without departing from the scope of claims of the present invention and the scope of their equivalents.

In this application, a plate-shaped member, such as a "polarizing plate", a "λ/2 wave plate", a "λ/4 wave plate", and a "phase difference plate", is not limited to a rigid member, and may have a film shape with flexibility.

An in-plane retardation Re and a retardation Rth in a thickness direction of a layer used herein are calculated by equations: $Re=(nx-ny) \times d$ and $Rth=[\{(nx+ny)/2\}-nz] \times d$, respectively. $nx$ is a refractive index of the layer in an in-plane slow axis direction (maximum in-plane refractive index), $ny$ is a refractive index of the layer in a direction perpendicular to the in-plane slow axis, $nz$ is a refractive index of the layer in the thickness direction, and $d$ is a thickness (nm) of the layer. Unless otherwise specified, an Nz factor is a value represented by $Nz=(nx-nz)/(nx-ny)=Rth/Re+0.5$. Unless otherwise specified, the measurement wavelength is 590 nm.

[1. Multilayer Film]

The multilayer film of the present invention includes a first long-length substrate and an optically anisotropic layer that is formed directly on the first substrate and contains cured liquid crystal molecules.

The "cured liquid crystal molecules" used herein means molecules of a compound capable of exhibiting a liquid crystal phase wherein the compound is in a solidified state while the state of liquid crystal phase is kept. Examples of the cured liquid crystal molecules may include a polymer obtained by polymerizing a polymerizable liquid crystal compound. Unless otherwise specified, this specific optically anisotropic layer containing the cured liquid crystal molecules is simply referred to as "optically anisotropic layer" in the following description.

[1.1. First Substrate]

The first substrate used in the present invention is a long-length substrate. The term "long-length" used herein means a shape having a length that is at least 5 times or more longer than the width, and preferably 10 times or more longer than the width, and specifically means a shape of a film having such a length that the film can be wound up into a roll shape for storage or conveyance. Although the upper limit of the ratio of the length relative to the width of the film is not particularly limited, for example, the upper limit may be 100,000 times or less.

The first substrate used in the present invention has a slow axis in a direction different from the lengthwise direction of the substrate. Specifically, an angle formed between the slow axis of the first substrate and the widthwise direction of the first substrate is 0° or more and less than 90°. Unless otherwise specified, the directions of slow axes of the first substrate and the optically anisotropic layer used herein represent a direction of the slow axis in an in-plane direction.

Unless otherwise specified, angles representing the slow axis directions of the substrate and the optically anisotropic layer herein are based on the widthwise direction of the substrate, and expressed as an angle relative to this direction. The angle formed between the slow axis direction of the substrate or the optically anisotropic layer and the widthwise direction of the substrate or the optically anisotropic layer may be simply referred to as "orientation angle".

The angle formed between the slow axis of the first substrate and the widthwise direction of the first substrate may be specifically 0° to 80°. When the first substrate has a slow axis at an angle falling within such a range, the multilayer film of the present invention can be a material capable of efficiently manufacturing a circularly polarizing plate, and the like.

In a certain aspect, the angle formed between the slow axis of the first substrate and the widthwise direction of the first substrate is preferably 40° to 80°, and particularly preferably 55° to 80°. When this angle relationship is satisfied, the multilayer film of the present invention can be a material capable of efficiently manufacturing a specific circularly polarizing plate. Specifically, a circularly polarizing plate having a linear polarizer and a single phase difference plate can be efficiently manufactured. When the multilayer film of the present invention has a first substrate having a specific Nz factor, a favorable orientation-regulating force may be expressed by diagonal stretching even with such an angle relationship. As a result, the multilayer film of the present invention can be a multilayer film having an optically anisotropic layer having a reduced number of defects.

In another aspect, when the angle formed between the slow axis of the first substrate and the widthwise direction of the first substrate is designed to fall within a specific range of preferably 15°±5°, 22.5°±5°, 45°±5°, or 75°±5°, more preferably 15°±4°, 22.5°±4°, 45°±4°, or 75°±4°, and further preferably 15°±3°, 22.5°±3°, 45°±3°, or 75°±3°, the multilayer film of the present invention can be a material capable of efficiently manufacturing a specific circularly polarizing plate.

The material for the first substrate is not particularly limited, and various resins capable of imparting an orientation-regulating force to a surface of the substrate by imparting birefringence may be used. Examples of the resins may include resins containing various types of polymers. Examples of the polymers may include an alicyclic structure-containing polymer, a cellulose ester, a polyvinyl alcohol, a polyimide, UV-transmitting acrylic, a polycarbonate, a polysulfone, a polyether sulfone, an epoxy polymer, a polystyrene, and combinations thereof. Among these, an alicyclic structure-containing polymer and a cellulose ester are preferable, and an alicyclic structure-containing polymer is more preferable from the viewpoint of transparency, low hygroscopicity, size stability, and low weight.

It is preferable that the first substrate is a film of a resin having a positive intrinsic birefringence. When the resin having a positive intrinsic birefringence is used as the material, a first substrate having favorable characteristics, such as high orientation-regulating force, high strength, and low cost can be easily obtained.

The alicyclic structure-containing polymer is an amorphous polymer having an alicyclic structure in a repeating unit. Both a polymer containing an alicyclic structure in a main chain and a polymer containing an alicyclic structure in a side chain may be used.

Examples of the alicyclic structure may include a cycloalkane structure and a cycloalkene structure. A cycloalkane structure is preferable from the viewpoint of thermal stability.

The number of carbon atoms constituting one repeating unit having the alicyclic structure is not particularly limited, but is usually 4 to 30, preferably 5 to 20, and more preferably 6 to 15.

The ratio of the repeating unit having the alicyclic structure in the alicyclic structure-containing polymer is appropriately selected depending on the purposes of use, and is usually 50% by weight or more, preferably 70% by weight or more, and more preferably 90% by weight or more. When the ratio of the repeating unit having the alicyclic structure is too low, the heat resistance of the film may be decreased.

Specific examples of the alicyclic structure-containing polymer may include (1) a norbornene polymer, (2) a monocyclic olefin polymer, (3) a cyclic conjugated diene polymer, (4) a vinyl alicyclic hydrocarbon polymer, and hydrogenated products thereof.

Among these, a norbornene polymer and a hydrogenated product thereof are more preferable from the viewpoint of transparency and moldability.

Examples of the norbornene polymer may include a ring-opened polymer of a norbornene monomer, a ring-opened copolymer of a norbornene monomer with a ring-opening copolymerizable monomer other than the norbornene monomer, and hydrogenated products thereof; and an addition polymer of a norbornene monomer, and an addition copolymer of a norbornene monomer with a copolymerizable monomer other than the norbornene monomer. Among these, a hydrogenated product of a ring-opened polymer of a norbornene monomer is the most preferable from the viewpoint of transparency.

The alicyclic structure-containing polymer is, for example, selected from known polymers disclosed in Japanese Patent Application Laid-Open No. 2002-321302 A and the like.

The glass transition temperature of the alicyclic structure-containing polymer is preferably 80° C. or higher, and more preferably within a range of 100 to 250° C.

The alicyclic structure-containing polymer having a glass transition temperature falling within this range is not deformed or does not generate stress during use at high temperature, and has excellent durability.

The molecular weight of the alicyclic structure-containing polymer as a weight-average molecular weight (Mw) measured by gel permeation chromatography (hereinafter abbreviated as "GPC") using cyclohexane (toluene when a resin is not dissolved) as a solvent in terms of polyisoprene (in terms of polystyrene when the solvent is toluene) is usually 10,000 to 100,000, preferably 25,000 to 80,000, and more preferably 25,000 to 50,000.

When the weight-average molecular weight thereof falls within such a range, the mechanical strength and molding processability of the film are highly balanced. Therefore, this is suitable.

Although the molecular weight distribution (weight-average molecular weight (Mw)/number-average molecular weight (Mn)) of the alicyclic structure-containing polymer is not particularly limited, it usually falls within a range of 1 to 10, preferably 1 to 4, and more preferably 1.2 to 3.5.

In a resin containing the alicyclic structure-containing polymer, the content of a resin component having a molecular weight of 2,000 or less (i.e., oligomer component) is preferably 5% by weight or less, more preferably 3% by weight or less, and further preferably 2% by weight or less.

When the amount of the oligomer component falls within the aforementioned range, the generation of minute convex portions on a surface is decreased. Consequently, the thickness unevenness is decreased, and the profile irregularity is improved.

In order to decrease the amount of the oligomer component, selection of a polymerization catalyst and a hydrogenation catalyst, reaction conditions of polymerization, hydrogenation, and the like, a temperature condition in a process of pelletizing the resin as a molding material, and the like may be optimized.

The amount of the oligomer component may be measured by GPC described above.

When the resin containing the alicyclic structure-containing polymer is used as the material for the first substrate, the thickness of the first substrate is not particularly limited. However, the thickness of the first substrate is usually 1 to 1,000 μm, preferably 5 to 300 μm, and more preferably 30 to 100 μm from the viewpoints of productivity improvement and facilitation of reducing thickness and weight.

The resin containing the alicyclic structure-containing polymer may be composed only of the alicyclic structure-containing polymer. However, the resin may contain any compounding agent as long as the effects of the present invention are not significantly impaired. The ratio of the alicyclic structure-containing polymer in the resin containing the alicyclic structure-containing polymer is preferably 70% by weight or more, and more preferably 80% by weight or more.

Specific suitable examples of the resin containing the alicyclic structure-containing polymer may include "ZEONOR 1420 and ZEONOR 1420R" available from ZEON Corporation.

A typical example of the cellulose ester is a lower fatty acid ester of cellulose (for example, cellulose acetate, cellulose acetate butyrate, and cellulose acetate propionate). A lower fatty acid means a fatty acid having 6 or less carbon atoms per one molecule. Examples of cellulose acetate includes triacetylcellulose (TAC) and cellulose diacetate (DAC).

The acetylation degree of cellulose acetate is preferably 50 to 70%, and particularly preferably 55 to 65%. The weight-average molecular weight of cellulose acetate is preferably 70,000 to 120,000, and particularly preferably 80,000 to 100,000. The aforementioned cellulose acetate may be esterified with not only acetic acid but also partially with a fatty acid, such as propionic acid and butyric acid, as long as the aforementioned acetylation degree is satisfied. The resin constituting the first substrate may contain cellulose acetate in combination with a cellulose ester other than cellulose acetate (cellulose propionate, cellulose butyrate, etc.). In this case, it is preferable that the overall cellulose esters satisfy the aforementioned acetylation degree.

When a film of triacetylcellulose is used as the first substrate, it is particularly preferable that such a film is a triacetylcellulose film formed using triacetylcellulose dope that is prepared by dissolving triacetylcellulose in a solvent essentially free of dichloromethane by a low-temperature dissolution method or a high-temperature dissolution method from the viewpoint of environmental conservation. The film of triacetylcellulose may be manufactured by a co-casting method. The co-casting method may be performed by dissolving raw material flakes of triacetylcellulose in a solvent, and if necessary, adding an optional additive to prepare a solution (dope), casting the dope on a support from dope supply means (die), drying the cast product to some extent, separating the cast product as a film from the support when rigidity has been imparted, and further drying the film to remove the solvent. Examples of the solvent for dissolving the raw material flakes may include halogenated hydrocarbons (dichloromethane, etc.), alcohols (methanol, ethanol, butanol, etc.), esters (methyl formate, methyl acetate, etc.), and ethers (dioxane, dioxolane, diethyl ether, etc.). Examples of the additive added to the dope may include a retardation-increasing agent, a plasticizer, an ultraviolet ray absorber, a deterioration preventing agent, a lubricant, and a separation promoter. Examples of the support on which the dope is cast may include a horizontal endless metal belt and a rotation drum. For casting, a single dope may be cast in a single layer. Alternatively, a plurality of layers may be formed by co-casting. In co-casting of a plurality of layers, for example, a plurality of dopes may be successively cast so that a layer of a low-concentration cellulose ester dope and layers of a high-concentration cellulose ester dope in contact with the front and back surfaces of the layer of the low-concentration cellulose ester dope are formed. Examples of means for drying the film to remove the solvent may include means for conveying the film to pass the film through a drying unit the interior portion of which is set to conditions suitable for drying.

Preferable examples of the film of triacetylcellulose may include known films such as TAC-TD80U (available from Fuji Photo Film Co., Ltd.), and a film disclosed in JIII journal of technical disclosure No. 2001-1745. Although the thickness of the film of triacetylcellulose is not particularly limited, it is preferably 20 to 150 µm, more preferably 40 to 130 µm, and further preferably 70 to 120 µm.

The first substrate has an orientation-regulating force caused by stretching, and has an orientation angle of 0° or more and less than 90°. Further, the Nz factor of the first substrate falls within a specific range, and the variation of orientation angle falls within a specific range.

The Nz factor of the first substrate is 1.1 or more, preferably 1.2 or more, and more preferably 1.6 or more, and is 3.0 or less, preferably 2.9 or less, and more preferably 2.3 or less. Since the Nz factor of the film is generally inconstant in the plane, the Nz factor of the film is usually evaluated by an average Nz factor. The average Nz factor of the film may be determined by measuring Nz factors at a plurality of points at intervals of 50 mm in the widthwise direction of the film, and calculating an average for the Nz factors at these points. A value obtained by subtracting the minimum value from the maximum value of the measured Nz factors (the variation of Nz factor) is 0.10 or less, preferably 0.09 or less, and more preferably 0.08 or less.

The variation of the orientation angle of the first substrate is 1.0° or less, and preferably 0.8° or less. Although the lower limit of the variation of the orientation angle is not particularly limited, it is ideally 0°. The variation of the orientation angle of the first substrate represents a difference between maximum and minimum values of the angle that is formed between the widthwise direction and the slow axis at any point of the first substrate.

The Nz factor may be measured by a phase difference meter (for example, trade name "AxoScan", manufactured by Axometrics, Inc.), with other optical characteristics such as Re. The variation of the orientation angle may be measured, for example, by observation using a polarized light microscope.

The present inventor has found that when the Nz factor and the variation of the orientation angle of the first substrate fall within the aforementioned specific ranges, a favorable orientation-regulating force can be obtained, and as a result, an optically anisotropic layer having a reduced number of defects such as a schlieren defects can be formed. The Nz factor and the orientation angle can be monitored as optical characteristics of the first substrate. Therefore, the Nz factor and the orientation angle can be easily measured as indicators of orientation-regulating force in continuous manufacturing of the multilayer film. As a result, the quality of manufacturing can be easily controlled and a high-quality product can be efficiently manufactured.

A schlieren defect is a liquid crystal orientation defect in which orientation obtained by applying a liquid crystal compound onto a transparent substrate and orienting liquid crystal molecules is locally disturbed, resulting in non-homogeneous orientation. The number of schlieren defects in the optically anisotropic layer may be evaluated by counting the number of orientation defects appearing to be in a radial pattern in a dark background part where an optical axis of a polarizer or an analyzer and an orientation axis or an optical axis of the liquid crystal molecules are parallel or orthogonal to each other during observation of the optically anisotropic layer using a polarized light microscope.

Such a first substrate having the specific Nz factor and variation of the orientation angle may be prepared by stretching a film such as a film formed from the aforementioned material to impart optical anisotropy thereto. The stretching direction may be appropriately set in accordance with the desired orientation direction required for the optically anisotropic layer. The stretching may only be diagonal stretching, may only be lateral stretching (stretching in the widthwise direction of the first substrate), and may also be a combination of diagonal stretching with longitudinal stretching (stretching in the lengthwise direction of the first substrate) and/or lateral stretching. From the viewpoint of expressing the orientation-regulating force in the diagonal direction, stretching including one or more diagonal stretching processes is preferable. The stretching ratio may be appropriately set within a range that causes an orientation-regulating force on the surface of the substrate. When the resin having a positive intrinsic birefringence is used as the material for the first substrate, molecules are oriented in the stretching direction, to express the slow axis in the stretching direction.

Preferable examples of the stretching may include stretching including a combination of one or more diagonal stretching processes and one or more free longitudinal uniaxial stretching processes. By performing such stretching, the first substrate having desired Nz factor and variation of the orientation angle can be easily manufactured. Herein, the order of performing diagonal stretching and free longitudinal uniaxial stretching and the stretching ratio of each of the stretching processes are not particularly limited. However, it is preferable that the diagonal stretching is performed and then the free longitudinal uniaxial stretching is performed.

Specifically, examples of preferred aspect of the stretching may include stretching including:

Step (a): a step of stretching a long-length pre-stretch substrate at a stretching ratio B1 in a diagonal direction to obtain a long-length intermediate film, and Step (b): a step of free longitudinal uniaxial stretching of the intermediate film at a stretching ratio B2 that is smaller than the stretching ratio B1 after Step (a) while the intermediate film is continuously conveyed, to obtain a long-length stretched film.

The diagonal stretching in Step (a) may be performed by a known device, such as a tenter device that is capable of continuously performing stretching in a direction of which an angle relative to the widthwise direction of the pre-stretch substrate is more than 0° and less than 90°.

The stretching ratio B1 in Step (a) is preferably 1.1 times or more, and more preferably 1.5 times or more, and is preferably 4.0 times or less, and more preferably 3.0 times or less. When the stretching ratio B1 in Step (a) is equal to or more than the lower limit value of the aforementioned range, the Nz factor of the obtained first substrate can be a desired large value. When it is equal to or less than the upper limit value thereof, the orientation angle of the obtained first substrate can be easily controlled.

The stretching temperature T1 in Step (a) is preferably Tg° C. or higher, more preferably (Tg+2°) C. or higher, and particularly preferably (Tg+5°) C. or higher, and is preferably (Tg+40°) C. or lower, more preferably (Tg+35°) C. or lower, and particularly preferably (Tg+30°) C. or lower. Herein, Tg is the glass transition temperature of the resin forming the pre-stretch substrate. The stretching temperature is a temperature in a stretching zone of a device for stretching. When the stretching temperature T1 in Step (a) falls within the aforementioned range, molecules contained in the pre-stretch substrate can be surely oriented. Therefore, an intermediate film having desired optical characteristics can be easily obtained.

Since the molecules contained in the intermediate film are oriented by stretching in Step (a), the intermediate film has a slow axis. In Step (a), stretching is performed in the diagonal direction. Therefore, the slow axis of the intermediate film is expressed in the diagonal direction of the intermediate film. Specifically, the intermediate film usually has the slow axis at an angle within a range of 5° to 85° on an average relative to the widthwise direction of the intermediate film. Herein, that a film has a slow axis at an angle within a range on an average relative to the widthwise direction of the film means that when orientation angles θ formed between the widthwise direction and the slow axis of the film at a plurality of points in the widthwise direction of the film are measured, the average value of the orientation angles θ measured at those points falls within the aforementioned certain range. In particular, it is preferable that the direction of the slow axis of the intermediate film is set in accordance with the direction of the slow axis of the first substrate to be manufactured. The angle of the slow axis of the first substrate obtained in Step (b) relative to the widthwise direction thereof is usually larger than the angle of the slow axis of the intermediate film relative to the widthwise direction thereof. Therefore, it is preferable that the angle of the slow axis of the intermediate film relative to the widthwise direction thereof is smaller than the angle of the slow axis of the obtained first substrate relative to the widthwise direction thereof. For example, the intermediate film has the slow axis at an angle within a range of preferably 10° or more, and more preferably 20° or more, and preferably 40° or less, and more preferably 35° or less on an average relative to the widthwise direction thereof. Thereby a first substrate having an orientation angle θ of about 45° which is used for various applications as a film having a slow axis in a diagonal direction relative to the widthwise direction of the film can be easily obtained.

The free uniaxial stretching in Step (b) means stretching in a certain direction in which a restraining force is not applied in a direction other than a stretching direction. The free longitudinal uniaxial stretching therefore means stretching in a longitudinal direction without restriction of ends in the widthwise direction of the film. Such stretching in Step (b) is usually performed by a roll stretching machine while the intermediate film is continuously conveyed in the lengthwise direction.

The stretching ratio B2 in Step (b) is smaller than the stretching ratio B1 in Step (a). By this setting, a large Nz factor can be expressed in the first substrate without occurrence of wrinkle due to stretching. As described above, when stretching in the diagonal direction and free longitudinal uniaxial stretching are performed in this order and the stretching ratios are set to satisfy B1>B2, a first substrate having a slow axis in a diagonal direction relative to the widthwise direction, a large Nz factor, and small variation of orientation angle can be easily manufactured.

Specifically, the stretching ratio B2 in Step (b) is preferably 1.1 times or more, more preferably 1.15 times or more, and particularly preferably 1.2 times or more, and is preferably 2.0 times or less, more preferably 1.8 times or less, and particularly preferably 1.6 times or less. When the stretching ratio B2 in Step (b) is equal to or more than the lower limit value of the aforementioned range, a wrinkle of the obtained first substrate can be prevented. When it is equal to or less than the upper limit thereof, the Nz factor of the obtained first substrate can be increased.

The total stretching ratio (B1×B2) that is the combination of the stretching ratio B1 in Step (a) and the stretching ratio B2 in Step (b) is preferably 1.1 times or more, more preferably 1.5 times or more, and particularly preferably 1.9 times or more, and is preferably 4.5 times or less, more preferably 4.2 times or less, and particularly preferably 4.0 times or less. When the total stretching ratio is equal to or more than the lower limit value of the aforementioned range, the Nz factor of the obtained first substrate can be increased. When it is equal to or less than the upper limit value thereof, the orientation angle of the obtained first substrate can be easily controlled.

The stretching temperature T2 in Step (b) is preferably higher than (T1−5°) C., more preferably (T1−4°) C. or higher, and particularly preferably (T1−3°) C. or higher, and is preferably lower than (T1+5°) C., more preferably (T1+4°) C. or lower, and particularly preferably (T1+3°) C. or lower, on the basis of the stretching temperature T1 in Step (a). When the stretching temperature T2 in Step (b) falls within the aforementioned range, the obtained first substrate can have favorable properties.

The phase difference Re in the in-plane direction of the first substrate is preferably 30 nm or more, and more preferably 50 nm or more, and is preferably 500 nm or less, and more preferably 300 nm or less. The lower limit of birefringence Δn of the first substrate is preferably 0.000050 or more, and more preferably 0.000070 or more. In contrast, the upper limit of birefringence Δn of the first substrate is preferably 0.007500 or less, and more preferably 0.007000 or less. In particular, when the aforementioned resin containing the alicyclic structure-containing polymer or the resin containing triacetylcellulose is used as the material for the first substrate and optical characteristics within the aforementioned ranges are imparted, molecular directors can be oriented in an approximately uniform manner over the entire thickness direction of the first substrate, to impart a favorable orientation-regulating force to the surface of the first substrate. The stretching may be performed by a known stretching machine such as a tenter stretching machine.

On the other hand, a rubbing treatment can impart an orientation-regulating force only to the surface layer of the substrate. Use of an optical orientation film can also impart an orientation-regulating force only to a thin-film surface layer of an orientation film layer. The orientation-regulating force expressed only on the surface layer is alleviated by influence of environment (heat, light, oxygen, etc.) over the lapse of time. Thus, orientation defects can more frequently occur during formation of the optically anisotropic layer.

[1.2. Formation of Optically Anisotropic Layer on First Substrate]

The multilayer film of the present invention includes an optically anisotropic layer that is formed directly on the first substrate and contains the cured liquid crystal molecules.

The formation of the optically anisotropic layer "directly" on the first substrate means that the optically anisotropic layer is formed on the surface of the first substrate without another layer interposed therebetween. When the first substrate having an orientation-regulating force caused by stretching is adopted and the optically anisotropic layer is formed directly on the first substrate, the optically anisotropic layer having a slow axis in a desired direction can be obtained without generation of dusts, generation of cracks, or contamination of a foreign substance due to rubbing. As a result, an optically anisotropic layer having a reduced number of defects in orientation can be obtained. Specifically, it is possible to obtain an optically anisotropic layer with a reduced number of cracks and foreign substances that are observed by a microscope and a reduced number of orientation defects such as line defects. Furthermore, when the first substrate having the specific Nz factor and the variation of the orientation angle as described above is adopted and the optically anisotropic layer is formed directly on the first substrate, a favorable orientation-regulating force can be obtained. As a result, an optically anisotropic layer having a reduced number of defects such as schlieren defects can be easily obtained.

The optically anisotropic layer is typically formed on the first substrate by a method including Step (I): a step of feeding out the specific long-length first substrate described above in the lengthwise direction;

Step (II): a step of applying a liquid crystal composition containing a polymerizable liquid crystal compound directly onto the fed-out first substrate to form a layer of the liquid crystal composition;

Step (III): a step of orienting the polymerizable liquid crystal compound in the layer of the liquid crystal composition; and Step (IV): a step of polymerizing the polymerizable liquid crystal compound to form cured liquid crystal molecules.

Step (I) may be performed by preparing a roll of the specific long-length first substrate described above, and feeding out the first substrate from the roll.

Step (II) may be performed by applying the liquid crystal composition directly onto one surface of the continuously conveyed first substrate. The conveyance direction of the substrate may be usually the same as the applying direction of the liquid crystal composition. Examples of the method of applying may include a curtain coating method, an extrusion coating method, a roll coating method, a spin coating method, a dip coating method, a bar coating method, a spray coating method, a slide coating method, a printing coating method, a gravure coating method, a die coating method, a gap coating method, and a dipping method. For example, when a die coater is disposed in the die coating method so that the lip direction of the die coater is parallel to the widthwise direction of the substrate, the applying direction of the liquid crystal composition is the same as the conveyance direction of the substrate, that is, the lengthwise direction of the substrate. The thickness of the layer of the liquid crystal composition to be applied may be appropriately set in accordance with the desired thickness required for the optically anisotropic layer.

Step (III) may be achieved immediately by the application, but if necessary, be achieved by an orientation treatment such as heating after the application. Conditions of the orientation treatment may be appropriately set in accordance with the properties of the liquid crystal composition to be used. For example, the conditions may be conditions of treatment for 30 seconds to 5 minutes under a temperature condition of 50 to 160° C. When the composition of the ingredients of the liquid crystal composition to be used and treatment conditions are appropriately set, orientation along approximately the same direction as the direction of the slow axis of the first substrate can be achieved. Thereby, the applying direction of the liquid crystal composition to be used and the orientation direction of the polymerizable liquid crystal compound can be made different, that is, can intersect. The angle formed between the applying direction of the liquid crystal composition and the orientation direction of the polymerizable liquid crystal compound is preferably more than 5°, more preferably 10 to 90°, and further preferably 40 to 50°.

Step (IV) may be performed immediately after Step (III). Alternatively, a step of drying the layer of the liquid crystal composition may be performed, if necessary, before Step (IV) and after Step (III). The drying may be achieved by a drying method such as air drying, heat drying, drying under reduced pressure, and heat drying under reduced pressure. By the drying, the solvent can be removed from the layer of the liquid crystal composition.

In Step (IV), a method that is suitable for the properties of components of the liquid crystal composition, such as the polymerizable compound and a polymerization initiator, may be appropriately selected. Examples of the method may include an irradiation method with an active energy beam and a thermal polymerization method. The irradiation method with an active energy beam is preferable since the reaction can proceed at room temperature without heating. Examples of the active energy beam for irradiation in this method may include any energy beam, such as light such as visible light, ultraviolet light, and infrared light, and an electron beam. In particular, an irradiation method with light such as ultraviolet light is preferable because of simple operation. The upper limit of temperature during irradiation with ultraviolet light is preferably equal to or lower than the glass transition temperature (Tg) of the substrate. The upper limit of the temperature is usually within a range of 150° C. or lower, preferably 100° C. or lower, and particularly preferably 80° C. or lower. The lower limit of the temperature during irradiation with ultraviolet light may be 15° C. or higher. The irradiation intensity of ultraviolet light is usually within a range of 0.1 mW/cm$^2$ to 1,000 mW/cm$^2$, and preferably 0.5 mW/cm$^2$ to 600 mW/cm$^2$. The irradiation time of ultraviolet light is within a range of 1 second to 300 seconds, and preferably 5 seconds to 100 seconds. The integrated light amount of ultraviolet light (mJ/cm$^2$) is calculated by the irradiation intensity of ultraviolet light (mW/cm$^2$)×the irradiation time of ultraviolet light (second). As a light source for irradiation with ultraviolet light, a high-pressure mercury lamp, a metal halide lamp, or a low-pressure mercury lamp may be used.

[1.3. Optically Anisotropic Layer]

In the multilayer film of the present invention, the cured liquid crystal molecules may have orientation regularity along approximately the same direction as the direction of the slow axis of the first substrate.

The cured liquid crystal molecules may preferably have homogeneous orientation regularity along approximately the same direction as the direction of the slow axis of the first substrate. Herein, "having homogeneous orientation regularity" means that an average direction of lines that are obtained by projecting long-axis directions of mesogens of the cured liquid crystal molecules to a film face is aligned in a certain direction horizontal to the film face (for example, direction of a surface director of a substrate film). Further, the homogeneous orientation regularity "along" the certain direction means that the alignment direction is approximately the same as the certain direction described above. For example, the certain direction is the direction of the surface director of the substrate film or the direction of the slow axis of the substrate film. The presence or absence of homogeneous orientation regularity of the cured liquid crystal molecules and the alignment direction thereof may be confirmed by measurement of the slow axis direction using a phase difference meter typified by AxoScan (manufactured by Axometrics, Inc.) and measurement of retardation distribution at each incident angle in the slow axis direction and the direction orthogonal to the slow axis.

Herein, when the cured liquid crystal molecules are obtained by polymerizing a polymerizable liquid crystal compound having a rod-like molecular structure, the long-axis direction of mesogen of the polymerizable liquid crystal compound is usually the long-axis direction of mesogen of the cured liquid crystal molecules. When a plurality of types of mesogens having different orientation directions exist in the optically anisotropic layer like in a case of using a polymerizable liquid crystal compound having inverse wavelength dispersion (described below) as the polymerizable liquid crystal compound, the direction in which the long-axis direction of mesogen of the longest type among the mesogens is aligned is referred to as the alignment direction.

Further, the orientation along "approximately" the same direction as the direction of the slow axis of the first substrate means that the angle formed between the direction of the slow axis of the first substrate and the alignment direction of mesogen is 5° or less. The angle is preferably 3° or less, and more preferably 1° or less.

When the first substrate having the certain slow axis described above is used and a material for the optically anisotropic layer is appropriately selected, orientation regularity such as homogeneous orientation regularity along approximately the same direction as the direction of the slow axis can be imparted to the optically anisotropic layer. As a result, the optically anisotropic layer having such orientation regularity can be obtained.

Although the thickness of the optically anisotropic layer is not particularly limited, the thickness may be appropriately adjusted so that characteristics such as retardation fall within a desired range. Specifically, the lower limit of the thickness is preferably 0.5 µm or more, and more preferably 1.0 µm or more. On the other hand, the upper limit of the thickness is preferably 10 µm or less, more preferably 7 µm or less, and further preferably 5 µm or less.

The shape, and length and width of the optically anisotropic layer may be those of a long-length film having the same shape as that of the first substrate. This optically anisotropic layer may be cut into a shape such as a rectangle suitable for desired application, if necessary.

It is preferable that the optically anisotropic layer has inverse wavelength dispersion. Specifically, it is preferable that the optically anisotropic layer has wavelength dispersion that exhibits higher in-plane phase difference for transmitted light having longer wavelength as compared with transmitted light having shorter wavelength. It is preferable that the optically anisotropic layer has inverse wavelength dispersion over at least a part of, and preferably the entire visible light region. When the optically anisotropic layer has inverse wavelength dispersion, the function can be uniformly expressed over a wide region for optical applications such as a λ/4 wave plate and a λ/2 wave plate.

In a preferred aspect, the optically anisotropic layer is a λ/4 wave plate or a λ/2 wave plate. Specifically, when the in-plane retardation Re measured at a measurement wavelength of 590 nm falls within a range of 108 nm to 168 nm, the optically anisotropic layer can be used as a λ/4 wave plate. When the in-plane retardation Re measured at a measurement wavelength of 590 nm falls within a range of 245 nm to 305 nm, the optically anisotropic layer can be used as a λ/2 wave plate. More specifically, in a case of the λ/4 wave plate, the in-plane retardation Re measured at a measurement wavelength of 590 nm preferably falls within a range of 128 nm to 148 nm, and more preferably 133 nm to 143 nm. In a case of the λ/2 wave plate, the in-plane retardation Re measured at a measurement wavelength of 590 nm preferably falls within a range of 265 nm to 285 nm, and more preferably 270 nm to 280 nm. When the optically anisotropic layer is such a λ/4 wave plate or such a λ/2 wave plate, an optical element such as a circularly polarizing plate having the λ/4 wave plate or the λ/2 wave plate can be easily manufactured using the optically anisotropic layer.

The angle formed between the slow axis of the optically anisotropic layer and the widthwise direction of the optically anisotropic layer may be the same as the angle formed between the slow axis of the first substrate and the widthwise direction of the first substrate. Specifically, the angle formed between the slow axis of the optically anisotropic layer and the widthwise direction of the optically anisotropic layer may be specifically 0° to 80°. In a certain aspect, the angle formed between the slow axis of the optically anisotropic layer and the widthwise direction of the optically anisotropic layer is particularly preferably 40° to 50°. Specifically, the angle formed between the slow axis of the optically anisotropic layer and the widthwise direction of the optically anisotropic layer preferably falls within a specific range of 15°±5°, 22.5°±5°, 45°±5°, or 75°±5°, more preferably 15°±4°, 22.5°±4°, 45°±4°, or 75°±4°, and further preferably 15°±3°, 22.5°±3°, 45°±3°, or 75°±3°. When the optically anisotropic layer has such an angle relationship, the multilayer film of the present invention can be a material capable of efficiently manufacturing a specific circularly polarizing plate.

[1.4. Liquid Crystal Composition]

The liquid crystal composition containing the polymerizable liquid crystal compound that may be used for manufacturing of the multilayer film of the present invention (hereinafter the composition is sometimes abbreviated as "composition (A)") will be described.

The liquid crystal compound as a component of the composition (A) herein is a compound capable of exhibiting a liquid crystal phase when the compound is mixed in the composition (A) and oriented. The polymerizable liquid crystal compound is a liquid crystal compound that is capable of being polymerized in the composition (A) while the liquid crystal phase is exhibited, to form a polymer in which the orientation of molecules in the liquid crystal phase is maintained. Further, the polymerizable liquid crystal compound having inverse wavelength dispersion is a polymerizable liquid crystal compound in which a polymer obtained as described above exhibits inverse wavelength dispersion.

Herein, compounds having polymerizability (the polymerizable liquid crystal compound, other compounds having polymerizability, etc.) as the component of the composition (A) are sometimes generally referred to as a "polymerizable compound".

[1.4.1. Polymerizable Liquid Crystal Compound]

Examples of the polymerizable liquid crystal compound may include a liquid crystal compound having a polymerizable group, a compound capable of forming a side chain-type liquid crystal polymer, and a discotic liquid crystal compound. Examples of the liquid crystal compound having a polymerizable group may include rod-like liquid crystal compounds having a polymerizing group described in, for example, Japanese Patent Application Laid-Open Nos. Hei. 11-513360 A, 2002-030042 A, 2004-204190 A, 2005-263789 A, 2007-119415 A, and 2007-186430 A. Examples of the side chain-type liquid crystal polymer compound may include a side chain-type liquid crystal polymer compound described in, for example, Japanese Patent Application Laid-Open No. 2003-177242 A. Examples of a product name of a preferred liquid crystal compound may include "LC242" available from BASF. Specific examples of the discotic liquid crystal compound are described in Japanese Patent Application Laid-Open No. Hei. 08-50206 A, and documents (C. Destrade et al., Mol. Cryst. Liq. Cryst., vol. 71, page 111 (1981); Quarterly Chemical Review by the Chemical Society of Japan, No. 22, Chemistry of Liquid Crystals, Chapter 5, Section 2 of Chapter 10 (1994); B. Kohne et al., Angew. Chem. Soc. Chem. Comm., page 1794 (1985); and J. Zhang et al., J. Am. Chem. Soc., vol. 116, page 2655 (1994)). As the liquid crystal compound and the polymerizable liquid crystal compound having inverse wavelength dispersion described below, one type thereof may be solely used, and two or more types thereof may also be used in combination at any ratio.

[1.4.2. Polymerizable Liquid Crystal Compound Having Inverse Wavelength Dispersion]

As a part of or all of the polymerizable liquid crystal compound, a polymerizable liquid crystal compound having inverse wavelength dispersion may be used. When the polymerizable liquid crystal compound having inverse wavelength dispersion is used, an optically anisotropic layer having inverse wavelength dispersion can be easily obtained.

Examples of the polymerizable liquid crystal compound having inverse wavelength dispersion may include a compound having a main chain mesogen and a side chain mesogen bonded to the main chain mesogen in the molecule. In a state where the polymerizable liquid crystal compound having inverse wavelength dispersion is oriented, the side chain mesogen can be oriented in a direction different from that of the main chain mesogen. Therefore, the main chain mesogen and the side chain mesogen can be oriented in different directions in the optically anisotropic layer.

Due to such an orientation, the optically anisotropic layer can exhibit inverse wavelength dispersion characteristics.

[1.4.2.1. Compound (I)]

Examples of the polymerizable liquid crystal compound having inverse wavelength dispersion may include a compound represented by the following formula (I) (hereinafter sometimes referred to as "compound (I)").

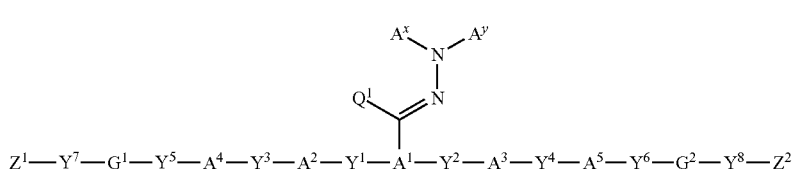

(I)

$$Z^1-Y^7-G^1-Y^5-A^4-Y^3-A^2-Y^1-A^1-Y^2-A^3-Y^4-A^5-Y^6-G^2-Y^8-Z^2$$

When the polymerizable liquid crystal compound having inverse wavelength dispersion is the compound (I), a -$Y^5$-$A^4$-$Y^3$-$A^2$-$Y^1$-$A^1$-$Y^2$-$A^3$-$Y^4$-$A^5$-$Y^6$- group is the main chain mesogen, and a >$A^1$-C($Q^1$)=N—N($A^x$)$A^y$ group is the side chain mesogen. The $A^1$ group affects both properties of the main chain mesogen and the side chain mesogen.

In the formula, $Y^1$ to $Y^8$ are each independently a chemical single bond, —O—, —S—, —O—C(=O)—, —C(=O)—O—, —O—C(=O)—O—, —$NR^1$—C(=O)—, —C(=O)—$NR^1$—, —O—C(=O)—$NR^1$—, —$NR^1$—C(=O)—O—, —$NR^1$—C(=O)—$NR^1$—, —O—$NR^1$—, or —$NR^1$—O—.

Herein, $R^1$ is a hydrogen atom or an alkyl group having 1 to 6 carbon atoms.

Examples of the alkyl group having 1 to 6 carbon atoms of $R^1$ may include a methyl group, an ethyl group, an n-propyl group, an isopropyl group, an n-butyl group, a sec-butyl group, a t-butyl group, an n-pentyl group, and an n-hexyl group.

It is preferable that $R^1$ is a hydrogen atom or an alkyl group having 1 to 4 carbon atoms.

In the compound (I), it is preferable that $Y^1$ to $Y^8$ are each independently a chemical single bond, —O—, —O—C(=O)—, —C(=O)—O—, or —O—C(=O)—O—.

$G^1$ and $G^2$ are each independently a divalent aliphatic group optionally having a substituent and having 1 to 20 carbon atoms.

Examples of the divalent aliphatic group having 1 to 20 carbon atoms may include a divalent aliphatic group having a linear structure, such as an alkylene group having 1 to 20 carbon atoms and an alkenylene group having 2 to 20 carbon atoms; and a divalent aliphatic group, such as a cycloalkanediyl group having 3 to 20 carbon atoms, a cycloalkenediyl group having 4 to 20 carbon atoms, and a divalent alicyclic fused ring group having 10 to 30 carbon atoms.

Examples of the substituent in the divalent aliphatic group of $G^1$ and $G^2$ may include a halogen atom, such as a fluorine atom, a chlorine atom, a bromine atom, and an iodine atom; and an alkoxy group having 1 to 6 carbon atoms, such as a methoxy group, an ethoxy group, an n-propoxy group, an isopropoxy group, an n-butoxy group, a sec-butoxy group, a t-butoxy group, an n-pentyloxy group, and an n-hexyloxy group. Among these, a fluorine atom, a methoxy group, and an ethoxy group are preferable.

The aforementioned aliphatic groups may have —O—, —S—, —O—C(=O)—, —C(=O)—O—, —O—C(=O)—O—, —NR$^2$—C(=O)—, —C(=O)—NR$^2$—, —NR$^2$—, or —C(=O)— inserted into the groups, provided that cases where two or more —O— or —S— groups are adjacently inserted are excluded. Herein, R$^2$ is a hydrogen atom or an alkyl group having 1 to 6 carbon atoms, which are the same as those for R$^1$. It is preferable that R$^2$ is a hydrogen atom or a methyl group.

It is preferable that the group inserted into the aliphatic groups is —O—, —O—C(=O)—, —C(=O)—O—, or —C(=O)—.

Specific examples of the aliphatic groups into which the group is inserted may include —CH$_2$—CH$_2$—O—CH$_2$—CH$_2$—, —CH$_2$—CH$_2$—S—CH$_2$—CH$_2$—, —CH$_2$—CH$_2$—O—C(=O)—CH$_2$—CH$_2$—, —CH$_2$—CH$_2$—C(=O)—O—CH$_2$—CH$_2$—, —CH$_2$—CH$_2$—C(=O)—O—CH$_2$—, —CH$_2$—O—C(=O)—O—CH$_2$—CH$_2$—, —CH$_2$—CH$_2$—NR$^2$—C(=O)—CH$_2$—CH$_2$—, —CH$_2$—CH$_2$—C(=O)—NR$^2$—CH$_2$—, —CH$_2$—NR$^2$—CH$_2$—CH$_2$—, and —CH$_2$—C(=O)—CH$_2$—.

Among these, from the viewpoint of favorably obtaining the desired effect of the present invention, G$^1$ and G$^2$ are each independently preferably a divalent aliphatic group having a linear structure, such as an alkylene group having 1 to 20 carbon atoms and an alkenylene group having 2 to 20 carbon atoms, more preferably an alkylene group having 1 to 12 carbon atoms, such as a methylene group, an ethylene group, a trimethylene group, a propylene group, a tetramethylene group, a pentamethylene group, a hexamethylene group, an octamethylene group, and a decamethylene group [—(CH$_2$)$_{10}$—], and particularly preferably a tetramethylene group [—(CH$_2$)$_4$—], a hexamethylene group [—(CH$_2$)$_6$—], an octamethylene group [—(CH$_2$)$_8$—], or a decamethylene group [—(CH$_2$)$_{10}$—].

Z$^1$ and Z$^2$ are each independently an alkenyl group having 2 to 10 carbon atoms that is unsubstituted or substituted by a halogen atom.

It is preferable that the number of carbon atoms in the alkenyl group is 2 to 6. Examples of the halogen atom that is a substituent in the alkenyl group of Z$^1$ and Z$^2$ may include a fluorine atom, a chlorine atom, and a bromine atom. A chlorine atom is preferable.

Specific examples of the alkenyl group having 2 to 10 carbon atoms of Z$^1$ and Z$^2$ may include CH$_2$=CH—, CH$_2$=C(CH$_3$)—, CH$_2$=CH—CH$_2$—, CH$_3$—CH=CH—, CH$_2$=CH—CH$_2$—CH$_2$—, CH$_2$=C(CH$_3$)—CH$_2$—CH$_2$—, (CH$_3$)$_2$C=CH—CH$_2$—, (CH$_3$)$_2$C=CH—CH$_2$—CH$_2$—, CH$_2$=C(Cl)—, CH$_2$=C(CH$_3$)—CH$_2$—, and CH$_3$—CH=CH—CH$_2$—.

Among these, from the viewpoint of favorably obtaining the desired effect of the present invention, Z$^1$ and Z$^2$ are each independently preferably CH$_2$=CH—, CH$_2$=C(CH$_3$)—, CH$_2$=C(Cl)—, CH$_2$=CH—CH$_2$—, CH$_2$=C(CH$_3$)—CH$_2$—, or CH$_2$=C(CH$_3$)—CH$_2$—CH$_2$—, more preferably CH$_2$=CH—, CH$_2$=C(CH$_3$)—, or CH$_2$=C(Cl)—, and particularly preferably CH$_2$=CH—.

A$^x$ is an organic group having 2 to 30 carbon atoms and at least one aromatic ring selected from the group consisting of an aromatic hydrocarbon ring and an aromatic heterocyclic ring.

In the present invention, "aromatic ring" means a cyclic structure having aromaticity in the broad sense based on Huckel rule, that is, a cyclic conjugated structure having (4n+2) π electrons, and a structure that exhibits aromaticity by involvement of a lone pair of electrons in a heteroatom such as sulfur, oxygen, and nitrogen in a π electron system, typified by thiophene, furan, and benzothiazole.

The organic group having 2 to 30 carbon atoms and at least one aromatic ring selected from the group consisting of an aromatic hydrocarbon ring and an aromatic heterocyclic ring, of A$^x$, may have a plurality of aromatic rings, or have an aromatic hydrocarbon ring and an aromatic heterocyclic ring.

Examples of the aromatic hydrocarbon ring may include a benzene ring, a naphthalene ring, and an anthracene ring. Examples of the aromatic heterocyclic ring may include a monocyclic aromatic heterocyclic ring, such as a pyrrole ring, a furan ring, a thiophene ring, a pyridine ring, a pyridazine ring, a pyrimidine ring, a pyrazine ring, a pyrazole ring, an imidazole ring, an oxazole ring, and a thiazole ring; and a fused aromatic heterocyclic ring, such as a benzothiazole ring, a benzoxazole ring, a quinoline ring, a phthalazine ring, a benzimidazole ring, a benzopyrazole ring, a benzofuran ring, a benzothiophene ring, a thiazolopyridine ring, an oxazolopyridine ring, a thiazolopyrazine ring, an oxazolopyrazine ring, a thiazolopyridazine ring, an oxazolopyridazine ring, a thiazolopyrimidine ring, and an oxazolopyrimidine ring.

The aromatic ring of A$^x$ may have a substituent. Examples of the substituent may include a halogen atom, such as a fluorine atom and a chlorine atom; a cyano group; an alkyl group having 1 to 6 carbon atoms, such as a methyl group, an ethyl group, and a propyl group; an alkenyl group having 2 to 6 carbon atoms, such as a vinyl group and an allyl group; a halogenated alkyl group having 1 to 6 carbon atoms, such as a trifluoromethyl group; a substituted amino group, such as a dimethylamino group; an alkoxy group having 1 to 6 carbon atoms, such as a methoxy group, an ethoxy group, and an isopropoxy group; a nitro group; an aryl group, such as a phenyl group and a naphthyl group; —C(=O)—R$^5$; —C(=O)—OR$^5$; and —SO$_2$R$^6$. Herein, R$^5$ is an alkyl group having 1 to 20 carbon atoms, an alkenyl group having 2 to 20 carbon atoms, or a cycloalkyl group having 3 to 12 carbon atoms, and R$^6$ is an alkyl group having 1 to 20 carbon atoms, an alkenyl group having 2 to 20 carbon atoms, a phenyl group, or a 4-methylphenyl group, which are the same as those for R$^4$ described below.

The aromatic ring of A$^x$ may have a plurality of substituents that may be the same or different, and two adjacent substituents may be bonded together to form a ring. The formed ring may be a monocycle or a fused polycycle, and may be an unsaturated ring or a saturated ring.

The "number of carbon atoms" in the organic group having 2 to 30 carbon atoms of A$^x$ means the total number of carbon atoms in the entire organic group which excludes carbon atoms in the substituents (the same applied to A$^y$ described below).

Examples of the organic group having 2 to 30 carbon atoms and at least one aromatic ring selected from the group consisting of an aromatic hydrocarbon ring and an aromatic heterocyclic ring, of A$^x$, may include an aromatic hydrocarbon ring group; an aromatic heterocyclic ring group; an alkyl group having 3 to 30 carbon atoms and at least one aromatic ring selected from the group consisting of an aromatic hydrocarbon ring group and an aromatic heterocyclic ring group; an alkenyl group having 4 to 30 carbon atoms and at least one aromatic ring selected from the group consisting of an aromatic hydrocarbon ring group and an aromatic heterocyclic ring group; and an alkynyl group having 4 to 30 carbon atoms and at least one aromatic ring selected from the group consisting of an aromatic hydrocarbon ring group and an aromatic heterocyclic ring group.

Preferable specific examples of $A^x$ are as follows. However, in the present invention, $A^x$ is not limited to the following examples. In the following formulae, "—" represents an atomic bonding at any position of the ring (the same applied to the following).

(1) An aromatic hydrocarbon ring group

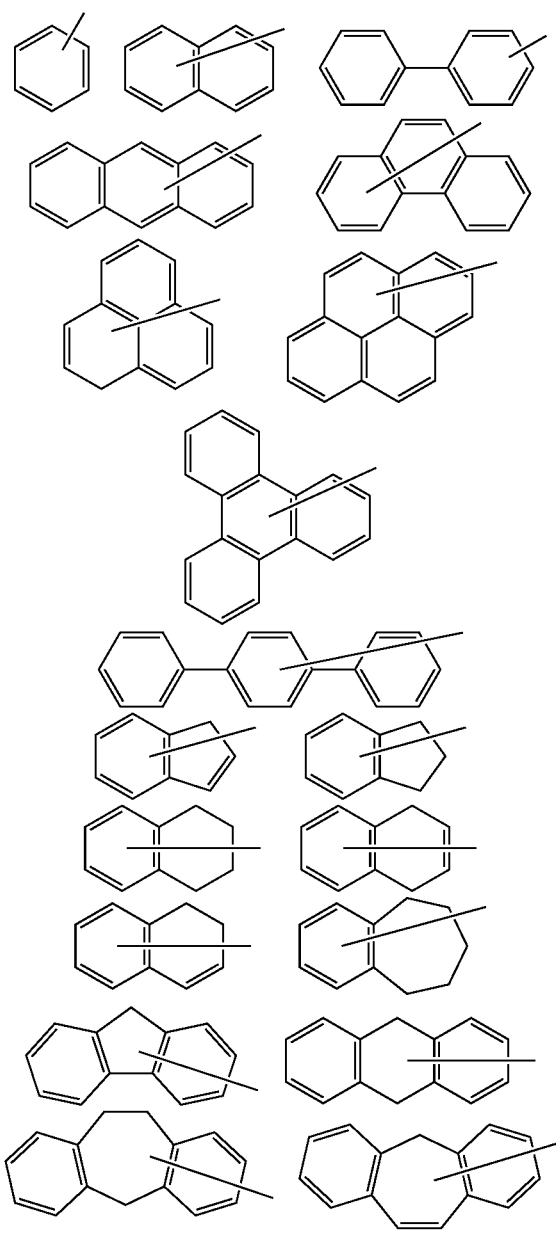

(2) An aromatic heterocyclic ring group

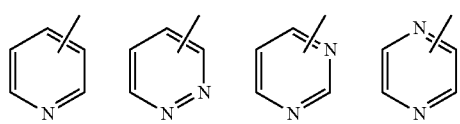

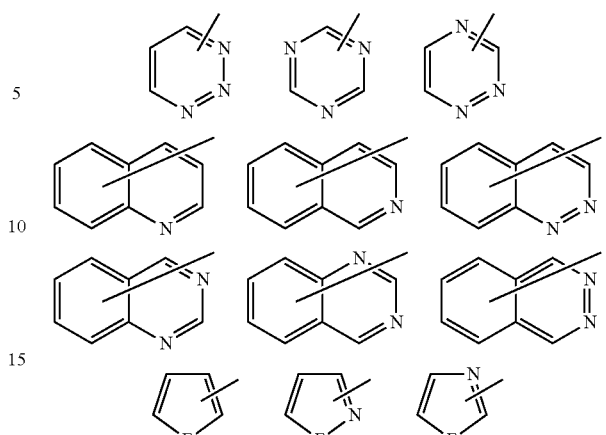

In the aforementioned formulae, E is $NR^{6a}$, an oxygen atom, or a sulfur atom. Herein, $R^{6a}$ is a hydrogen atom; or an alkyl group having 1 to 6 carbon atoms, such as a methyl group, an ethyl group, and a propyl group.

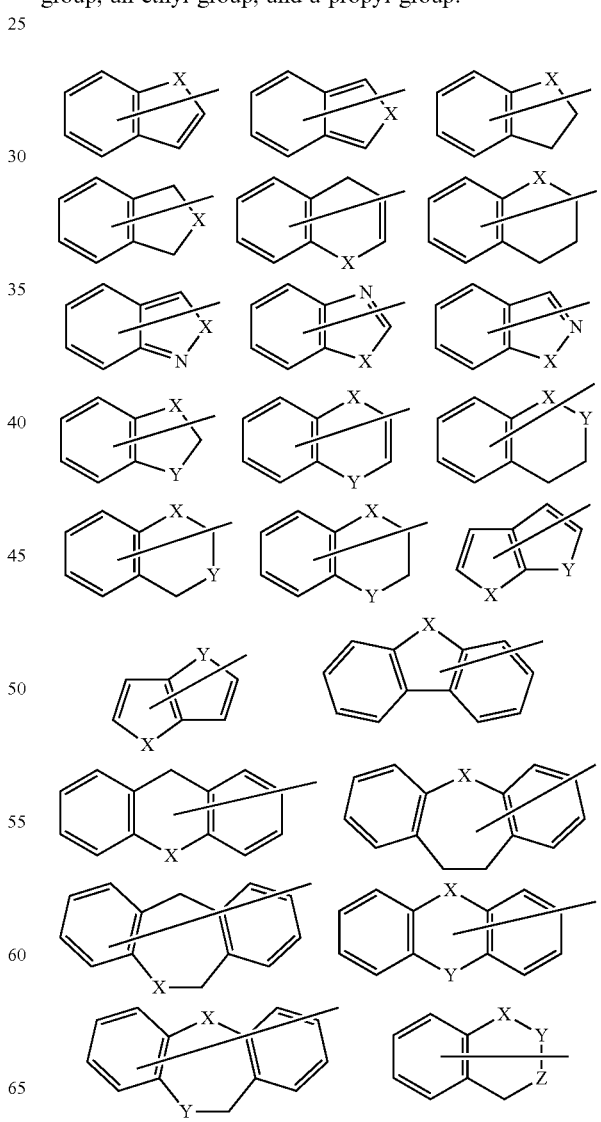

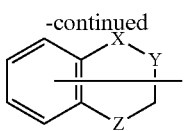

In the aforementioned formulae, X, Y, and Z are each independently $NR^7$, an oxygen atom, a sulfur atom, —SO—, or —SO$_2$— (provided that cases where an oxygen atom, a sulfur atom, —SO—, and —SO$_2$— are each adjacent are excluded). $R^7$ is a hydrogen atom; or an alkyl group having 1 to 6 carbon atoms such as a methyl group, an ethyl group, and a propyl group, which are the same as those for $R^{6a}$ described above.

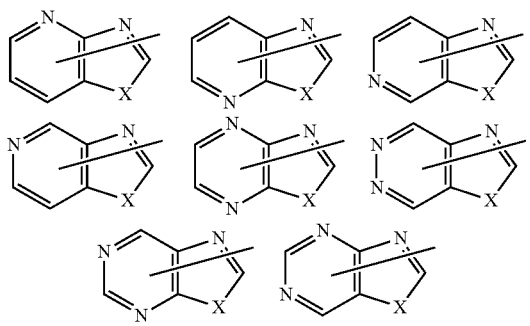

(In the aforementioned formulae, X has the same meanings as described above.)

(3) An alkyl group having at least one aromatic ring selected from the group consisting of an aromatic hydrocarbon ring group and an aromatic heterocyclic ring group

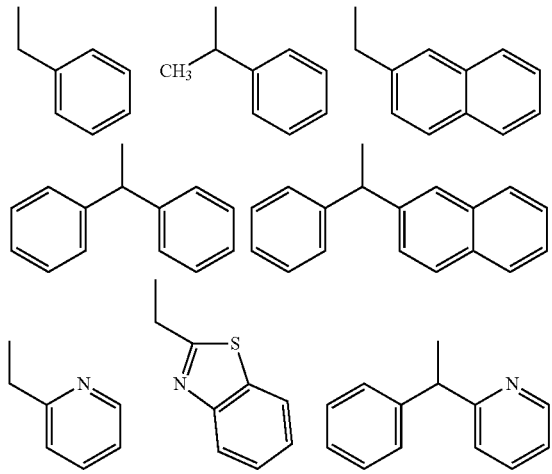

(4) An alkenyl group having at least one aromatic ring selected from the group consisting of an aromatic hydrocarbon ring group and an aromatic heterocyclic ring group

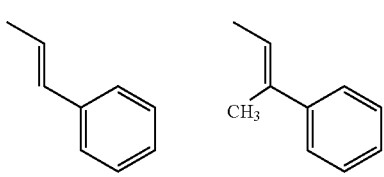

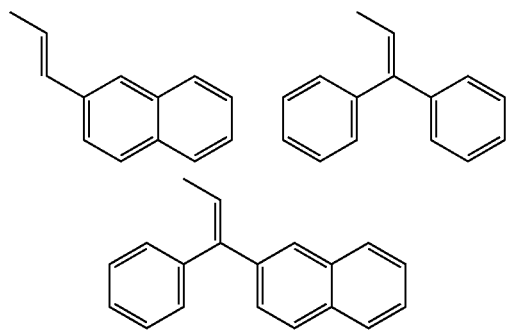

(5) An alkynyl group having at least one aromatic ring selected from the group consisting of an aromatic hydrocarbon ring group and an aromatic heterocyclic ring group

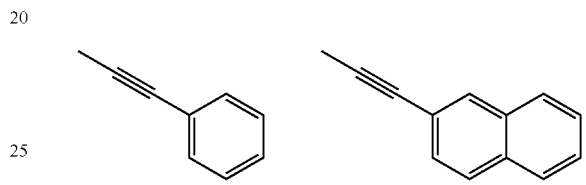

Among the groups of $A^x$, an aromatic hydrocarbon group having 6 to 30 carbon atoms and an aromatic heterocyclic ring group having 4 to 30 carbon atoms are preferable. Any groups shown below are more preferable.

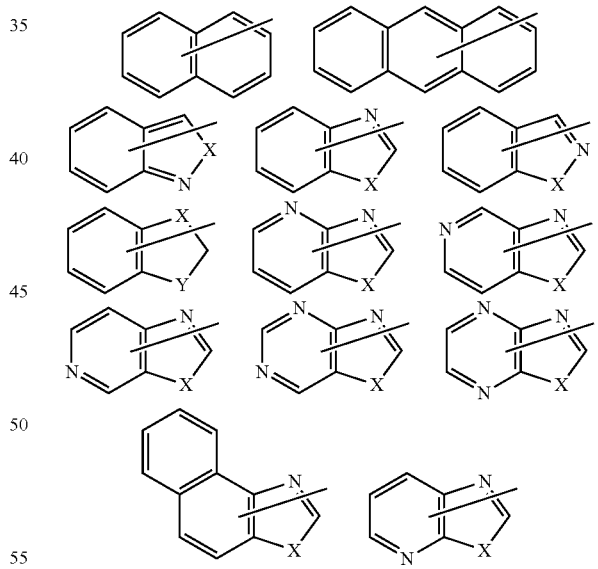

Any group shown below is further preferable.

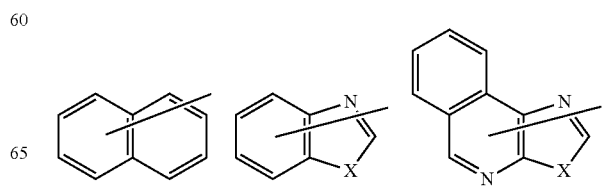

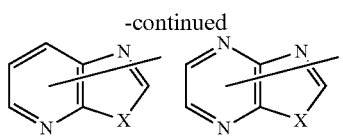

The ring of $A^x$ may have a substituent. Examples of the substituent may include a halogen atom, such as a fluorine atom and a chlorine atom; a cyano group; an alkyl group having 1 to 6 carbon atoms, such as a methyl group, an ethyl group, and a propyl group; an alkenyl group having 2 to 6 carbon atoms, such as a vinyl group and an allyl group; a halogenated alkyl group having 1 to 6 carbon atoms, such as a trifluoromethyl group; a substituted amino group, such as a dimethylamino group; an alkoxy group having 1 to 6 carbon atoms, such as a methoxy group, an ethoxy group, and an isopropoxy group; a nitro group; an aryl group, such as a phenyl group and a naphthyl group; —C(=O)—$R^8$; —C(=O)—$OR^8$; and —$SO_2R^6$. Herein, $R^8$ is an alkyl group having 1 to 6 carbon atoms, such as a methyl group and an ethyl group; or an aryl group having 6 to 14 carbon atoms, such as a phenyl group. Among these, a halogen atom, a cyano group, an alkyl group having 1 to 6 carbon atoms, and an alkoxy group having 1 to 6 carbon atoms are preferable.

The ring of $A^x$ may have a plurality of substituents that may be the same or different, and two adjacent substituents may be bonded together to form a ring. The formed ring may be a monocycle or a fused polycycle.

The "number of carbon atoms" in the organic group having 2 to 30 carbon atoms of $A^x$ means the total number of carbon atoms in the entire organic group which excludes carbon atoms in the substituents (the same applied to $A^y$ described below).

$A^y$ is a hydrogen atom, an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, an alkynyl group having 2 to 20 carbon atoms and optionally having a substituent, —C(=O)—$R^3$, —$SO_2$—$R^4$, —C(=S)NH—$R^9$, or an organic group having 2 to 30 carbon atoms and at least one aromatic ring selected from the group consisting of an aromatic hydrocarbon ring and an aromatic heterocyclic ring. Herein, $R^3$ is an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, or an aromatic hydrocarbon group having 5 to 12 carbon atoms; $R^4$ is an alkyl group having 1 to 20 carbon atoms, an alkenyl group having 2 to 20 carbon atoms, a phenyl group, or a 4-methylphenyl group; and $R^9$ is an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, or an aromatic group having 5 to 20 carbon atoms and optionally having a substituent.

Examples of the alkyl group having 1 to 20 carbon atoms in the alkyl group having 1 to 20 carbon atoms and optionally having a substituent of $A^y$ may include a methyl group, an ethyl group, an n-propyl group, an isopropyl group, an n-butyl group, an isobutyl group, a 1-methylpentyl group, a 1-ethylpentyl group, a sec-butyl group, a t-butyl group, an n-pentyl group, an isopentyl group, a neopentyl group, an n-hexyl group, an isohexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, and an n-icosyl group. The number of carbon atoms in the alkyl group having 1 to 20 carbon atoms and optionally having a substituent is preferably 1 to 12, and further preferably 4 to 10.

Examples of the alkenyl group having 2 to 20 carbon atoms in the alkenyl group having 2 to 20 carbon atoms and optionally having a substituent of $A^y$ may include a vinyl group, a propenyl group, an isopropenyl group, a butenyl group, an isobutenyl group, a pentenyl group, a hexenyl group, a heptenyl group, an octenyl group, a decenyl group, an undecenyl group, a dodecenyl group, a tridecenyl group, a tetradecenyl group, a pentadecenyl group, a hexadecenyl group, a heptadecenyl group, an octadecenyl group, a nonadecenyl group, and an icocenyl group.

The number of carbon atoms in the alkenyl group having 2 to 20 carbon atoms and optionally having a substituent is preferably 2 to 12.

Examples of the cycloalkyl group having 3 to 12 carbon atoms in the cycloalkyl group having 3 to 12 carbon atoms and optionally having a substituent of $A^y$ may include a cyclopropyl group, a cyclobutyl group, a cyclopentyl group, a cyclohexyl group, and a cyclooctyl group.

Examples of the alkynyl group having 2 to 20 carbon atoms in the alkynyl group having 2 to 20 carbon atoms and optionally having a substituent of $A^y$ may include an ethynyl group, a propynyl group, a 2-propynyl group (propargyl group), a butynyl group, a 2-butynyl group, a 3-butynyl group, a pentynyl group, a 2-pentynyl group, a hexynyl group, a 5-hexynyl group, a heptynyl group, an octynyl group, a 2-octynyl group, a nonanyl group, a decanyl group, and a 7-decanyl group.

Examples of the substituents in the alkyl group having 1 to 20 carbon atoms and optionally having a substituent and the alkenyl group having 2 to 20 carbon atoms and optionally having a substituent, of $A^y$, may include a halogen atom, such as a fluorine atom and a chlorine atom; a cyano group; a substituted amino group, such as a dimethylamino group; an alkoxy group having 1 to 20 carbon atoms, such as a methoxy group, an ethoxy group, an isopropyl group, and a butoxy group; an alkoxy group having 1 to 12 carbon atoms that is substituted by an alkoxy group having 1 to 12 carbon atoms, such as a methoxymethoxy group and a methoxyethoxy group; a nitro group; an aryl group, such as a phenyl group and a naphthyl group; a cycloalkyl group having 3 to 8 carbon atoms, such as a cyclopropyl group, a cyclopentyl group, and a cyclohexyl group; a cycloalkyloxy group having 3 to 8 carbon atoms, such as a cyclopentyloxy group and a cyclohexyloxy group; a cyclic ether group having 2 to 12 carbon atoms, such as a tetrahydrofuranyl group, a tetrahydropyranyl group, a dioxolanyl group, and a dioxanyl group; an aryloxy group having 6 to 14 carbon atoms, such as a phenoxy group and a naphthoxy group; a fluoroalkoxy group having 1 to 12 carbon atoms at least one of which is substituted by a fluorine atom, such as a trifluoromethyl group, a pentafluoroethyl group, and —$CH_2CF_3$; a benzofuryl group; a benzopyranyl group; a benzodioxolyl group; a benzodioxanyl group; —C(=O)—$R^{7a}$; —C(=O)—$OR^{7a}$; —$SO_2R^{8a}$; —$SR^{10}$; an alkoxy group having 1 to 12 carbon atoms that is substituted by —$SR^{10}$; and a hydroxyl group. Herein, $R^{7a}$ and $R^{10}$ are each independently an alkyl group having 1 to 20 carbon atoms, an alkenyl group having 2 to 20 carbon atoms, a cycloalkyl group having 3 to 12 carbon atoms, or an aromatic hydrocarbon group having 6 to 12 carbon atoms, and $R^{8a}$ is an alkyl group having 1 to 20 carbon atoms, an alkenyl group having 2 to 20 carbon atoms, a phenyl group, or a 4-methylphenyl group, which are the same as those for $R^4$ described above.

Examples of the substituent in the cycloalkyl group having 3 to 12 carbon atoms and optionally having a substituent of $A^y$ may include a halogen atom, such as a fluorine atom and a chlorine atom; a cyano group; a substituted amino group, such as a dimethylamino group; an alkyl group having 1 to 6 carbon atoms, such as a methyl group, an ethyl group, and a propyl group; an alkoxy group having 1 to 6 carbon atoms, such as a methoxy group, an ethoxy group, and an isopropoxy group; a nitro group; an aryl group, such as a phenyl group and a naphthyl group; a cycloalkyl group having 3 to 8 carbon atoms, such as a cyclopropyl group, a cyclopentyl group, and a cyclohexyl group; $-C(=O)-R^{7a}$; $-C(=O)-OR^{7a}$; $-SO_2R^{8a}$; and a hydroxyl group. Herein, $R^{7a}$ and $R^{8a}$ have the same meanings as described above.

Examples of the substituent in the alkynyl group having 2 to 20 carbon atoms and optionally having a substituent of $A^y$ may include substituents that are the same as the substituents in the alkyl group having 1 to 20 carbon atoms and optionally having a substituent and the alkenyl group having 2 to 20 carbon atoms and optionally having a substituent.

In the group represented by $-C(=O)-R^3$ of $A^y$, $R^3$ is an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, or an aromatic hydrocarbon group having 5 to 12 carbon atoms. Specific examples thereof may include those exemplified as the examples of the alkyl group having 1 to 20 carbon atoms and optionally having a substituent, the alkenyl group having 2 to 20 carbon atoms and optionally having a substituent, and the cycloalkyl group having 3 to 12 carbon atoms and optionally having a substituent, of $A^y$ described above.

In the group represented by $-SO_2-R^4$ of $A^y$, $R^4$ is an alkyl group having 1 to 20 carbon atoms, an alkenyl group having 2 to 20 carbon atoms, a phenyl group, or a 4-methylphenyl group.

Specific examples of the alkyl group having 1 to 20 carbon atoms and the alkenyl group having 2 to 20 carbon atoms, of $R^4$, may include those exemplified as the examples of the alkyl group having 1 to 20 carbon atoms and the alkenyl group having 2 to 20 carbon atoms, of $A^y$ described above.

Examples of the organic group having 2 to 30 carbon atoms and at least one aromatic ring selected from the group consisting of an aromatic hydrocarbon ring and an aromatic heterocyclic ring of $A^y$ may include those exemplified as the examples of $A^x$ described above.

Among these, $A^y$ is preferably a hydrogen atom, an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, an alkynyl group having 2 to 20 carbon atoms and optionally having a substituent, $-C(=O)-R^3$, $-SO_2-R^4$, or an organic group having 2 to 30 carbon atoms and at least one aromatic ring selected from the group consisting of an aromatic hydrocarbon ring and an aromatic heterocyclic ring. $A^y$ is further preferably a hydrogen atom, an alkyl group having 1 to 20 carbon atoms and optionally having a substituent, an alkenyl group having 2 to 20 carbon atoms and optionally having a substituent, a cycloalkyl group having 3 to 12 carbon atoms and optionally having a substituent, an alkynyl group having 2 to 20 carbon atoms and optionally having a substituent, an aromatic hydrocarbon group having 6 to 12 carbon atoms and optionally having a substituent, an aromatic heterocyclic ring group having 3 to 9 carbon atoms and optionally having a substituent, $-C(=O)-R^3$, or a group represented by $-SO_2-R^4$. Herein, $R^3$ and $R^4$ have the same meanings as described above.

It is preferable that substituents in the alkyl group having 1 to 20 carbon atoms and optionally having a substituent, the alkenyl group having 2 to 20 carbon atoms and optionally having a substituent, and the alkynyl group having 2 to 20 carbon atoms and optionally having a substituent, of $A^y$ are a halogen atom, a cyano group, an alkoxy group having 1 to 20 carbon atoms, an alkoxy group having 1 to 12 carbon atoms that is substituted by an alkoxy group having 1 to 12 carbon atoms, a phenyl group, a cyclohexyl group, a cyclic ether group having 2 to 12 carbon atoms, an aryloxy group having 6 to 14 carbon atoms, a hydroxyl group, a benzodioxanyl group, a phenylsulfonyl group, a 4-methylphenylsulfonyl group, a benzoyl group, or $-SR^{10}$. Herein, $R^{10}$ has the same meanings as described above.

It is preferable that substituents in the cycloalkyl group having 3 to 12 carbon atoms and optionally having a substituent, the aromatic hydrocarbon group having 6 to 12 carbon atoms and optionally having a substituent, and the aromatic heterocyclic group having 3 to 9 carbon atoms and optionally having a substituent, of $A^y$ are a fluorine atom, an alkyl group having 1 to 6 carbon atoms, an alkoxy group having 1 to 6 carbon atoms, or a cyano group.

$A^x$ and $A^y$ may together form a ring. Examples of the ring may include an unsaturated heterocyclic ring having 4 to 30 carbon atoms and optionally having a substituent and an unsaturated carbon ring having 6 to 30 carbon atoms and optionally having a substituent.

The unsaturated heterocyclic ring having 4 to 30 carbon atoms and the unsaturated carbon ring having 6 to 30 carbon atoms are not particularly restricted, and may or may not have aromaticity. Examples thereof may include rings shown below. The rings shown below are a moiety of:

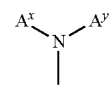

in the formula (I).

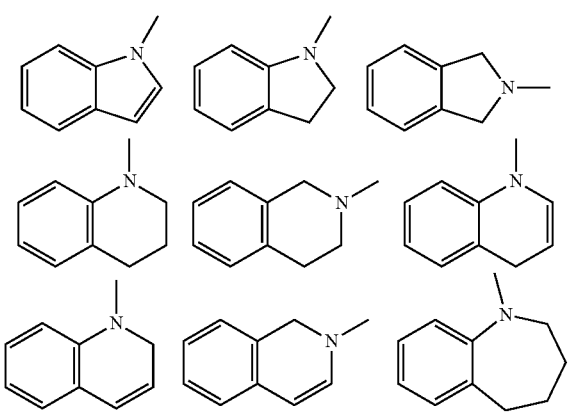

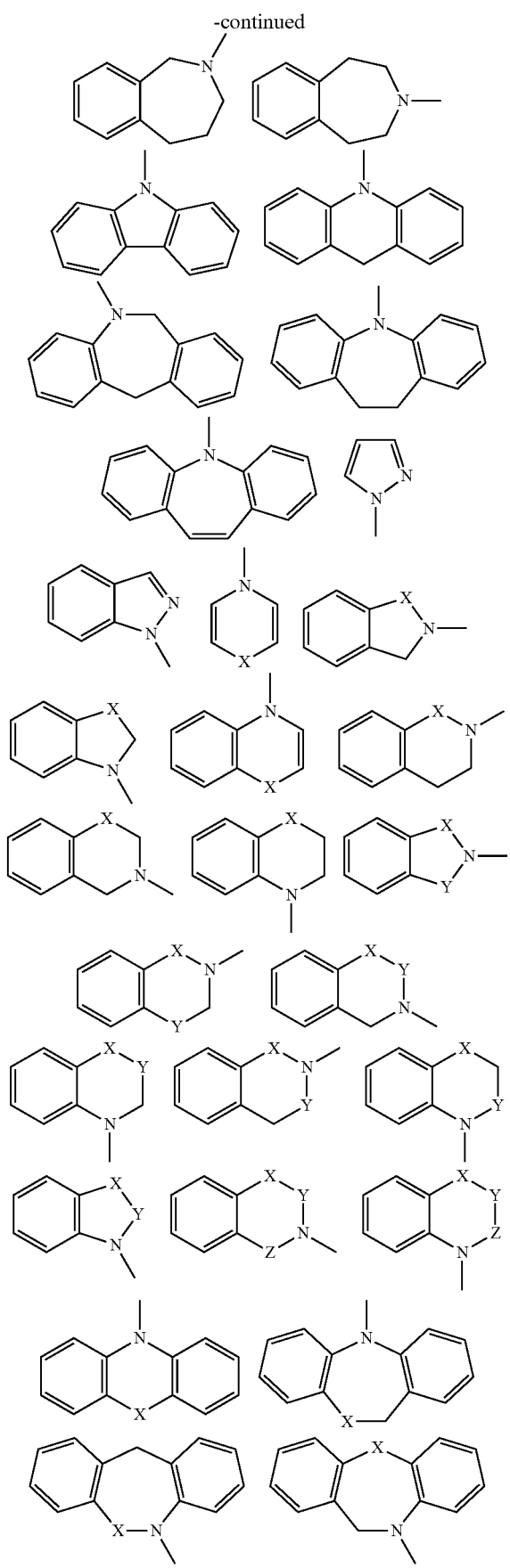

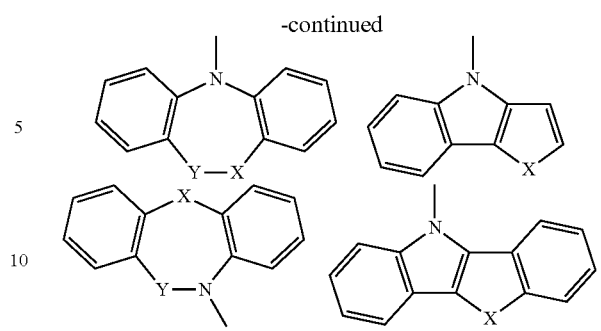

(In the formulae, X, Y, and Z have the same meanings as described above.)

The rings may have a substituent. Examples of the substituent may include those exemplified as the examples of the substituent in the aromatic ring of $A^x$.

The total number of π electrons contained in $A^x$ and $A^y$ is preferably 4 or more and 24 or less, more preferably 6 or more and 20 or less, and further preferably 6 or more and 18 or less from the viewpoint of favorably obtaining the desired effect of the present invention.

Examples of preferred combination of $A^x$ and $A^y$ may include:

(α) a combination of $A^x$ and $A^y$ in which $A^x$ is an aromatic hydrocarbon group having 4 to 30 carbon atoms or an aromatic heterocyclic ring group having 4 to 30 carbon atoms, and $A^y$ is a hydrogen atom, a cycloalkyl group having 3 to 8 carbon atoms, an aromatic hydrocarbon group having 6 to 12 carbon atoms and optionally having a substituent (a halogen atom, a cyano group, an alkyl group having 1 to 6 carbon atoms, an alkoxy group having 1 to 6 carbon atoms, or a cycloalkyl group having 3 to 8 carbon atoms), an aromatic heterocyclic ring group having 3 to 9 carbon atoms and optionally having a substituent (a halogen atom, an alkyl group having 1 to 6 carbon atoms, an alkoxy group having 1 to 6 carbon atoms, or a cyano group), an alkyl group having 1 to 20 carbon atoms and optionally having a substituent, an alkenyl group having 2 to 20 carbon atoms and optionally having a substituent, or an alkynyl group having 2 to 20 carbon atoms and optionally having a substituent, wherein the substituent is any of a halogen atom, a cyano group, an alkyl group having 1 to 20 carbon atoms, an alkoxy group having 1 to 12 carbon atoms that is substituted by an alkoxy group having 1 to 12 carbon atoms, a phenyl group, a cyclohexyl group, a cyclic ether group having 2 to 12 carbon atoms, an aryloxy group having 6 to 14 carbon atoms, a hydroxyl group, a benzodioxanyl group, a benzenesulfonyl group, a benzoyl group, and —$SR^{10}$; and (β) a combination of $A^x$ and $A^y$ in which $A^x$ and $A^y$ together form an unsaturated heterocyclic ring or an unsaturated carbon ring. Herein, $R^{10}$ has the same meanings as described above.

Examples of more preferred combination of $A^x$ and $A^y$ may include:

(γ) a combination of $A^x$ and $A^y$ in which $A^x$ is any of groups having the following structures, and $A^y$ is a hydrogen atom, a cycloalkyl group having 3 to 8 carbon atoms, an aromatic hydrocarbon group having 6 to 12 carbon atoms and optionally having a substituent (a halogen atom, a cyano group, an alkyl group having 1 to 6 carbon atoms, an alkoxy group having 1 to 6 carbon atoms, or a cycloalkyl group having 3 to 8 carbon atoms), an aromatic heterocyclic ring group having 3 to 9 carbon atoms and optionally having a substituent (a halogen atom, an alkyl group having 1 to carbon atoms, an alkoxy group having 1 to 6 carbon atoms, or a cyano group), an alkyl group having 1 to 20 carbon atoms and optionally having a substituent, an alkenyl group having 2 to 20 carbon atoms and optionally having a substituent, or an alkynyl group having 2 to 20 carbon atoms and optionally having a substituent, wherein the substituent is any of a halogen atom, a cyano group, an alkoxy group having 1 to 20 carbon atoms, an alkoxy group having 1 to 12 carbon atoms that is substituted by an alkoxy group having 1 to 12 carbon atoms, a phenyl group, a cyclohexyl group, a cyclic ether group having 2 to 12 carbon atoms, an aryloxy group having 6 to 14 carbon atoms, a hydroxyl group, a benzodioxanyl group, a benzenesulfonyl group, a benzoyl group, and —SR$^{10}$. Herein, R$^{10}$ has the same meanings as described above.

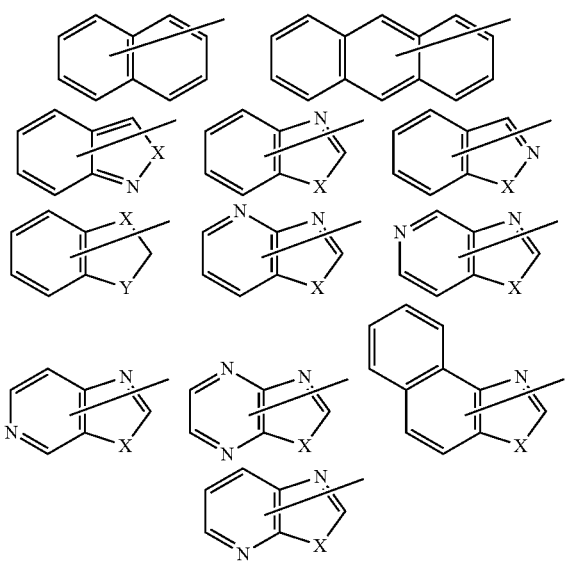

(In the formulae, X and Y have the same meanings as described above.)

Examples of particularly preferred combination of A$^x$ and A$^y$ may include:

(δ) a combination of A$^x$ and A$^y$ in which A$^x$ is any of groups having the following structures, and A$^y$ is a hydrogen atom, a cycloalkyl group having 3 to 8 carbon atoms, an aromatic hydrocarbon group having 6 to 12 carbon atoms and optionally having a substituent (a halogen atom, a cyano group, an alkyl group having 1 to 6 carbon atoms, an alkoxy group having 1 to 6 carbon atoms, or a cycloalkyl group having 3 to 8 carbon atoms), an aromatic heterocyclic ring group having 3 to 9 carbon atoms and optionally having a substituent (a halogen atom, an alkyl group having 1 to 6 carbon atoms, an alkoxy group having 1 to 6 carbon atoms, or a cyano group), an alkyl group having 1 to 20 carbon atoms and optionally having a substituent, an alkenyl group having 2 to 20 carbon atoms and optionally having a substituent, or an alkynyl group having 2 to 20 carbon atoms and optionally having a substituent, wherein the substituent is any of a halogen atom, a cyano group, an alkoxy group having 1 to 20 carbon atoms, an alkoxy group having 1 to 12 carbon atoms that is substituted by an alkoxy group having 1 to 12 carbon atoms, a phenyl group, a cyclohexyl group, a cyclic ether group having 2 to 12 carbon atoms, an aryloxy group having 6 to 14 carbon atoms, a hydroxyl group, a benzodioxanyl group, a benzenesulfonyl group, a benzoyl group, and —SR$^{10}$. In the following formulae, X has the same meanings as described above. Herein, R$^{10}$ has the same meanings as described above.

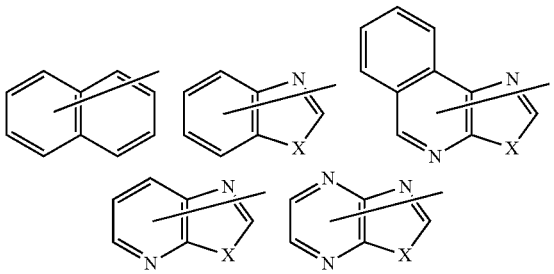

A$^1$ is a trivalent aromatic group optionally having a substituent. The trivalent aromatic group may be a trivalent carbocyclic aromatic group or a trivalent heterocyclic aromatic group. From the viewpoint of favorably obtaining the desired effect of the present invention, the trivalent aromatic group is preferably the trivalent carbocyclic aromatic group, more preferably a trivalent benzene ring group or a trivalent naphthalene ring group, and further preferably a trivalent benzene ring group or a trivalent naphthalene ring group that is represented by the following formula.

In the following formulae, substituents Y$^1$ and Y$^2$ are described for the sake of convenience to clearly show a bonding state (Y$^1$ and Y$^2$ have the same meanings as described above, and the same applied to the following).

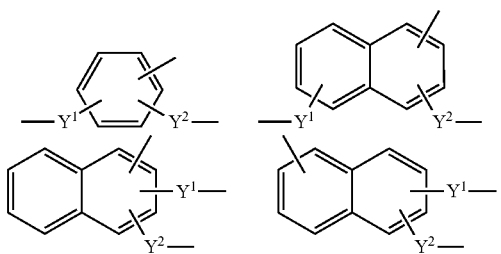

Among these, it is preferable that A$^1$ is a group represented by each of the following formulae (A11) to (A25), more preferably a group represented by the formula (A11), (A13), (A15), (A19), or (A23), and particularly preferably a group represented by the formula (A11) or (A23).

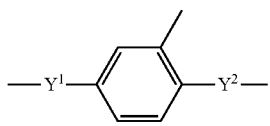
(A11)

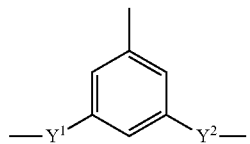
(A12)

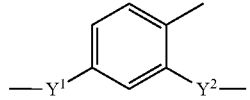
(A13)

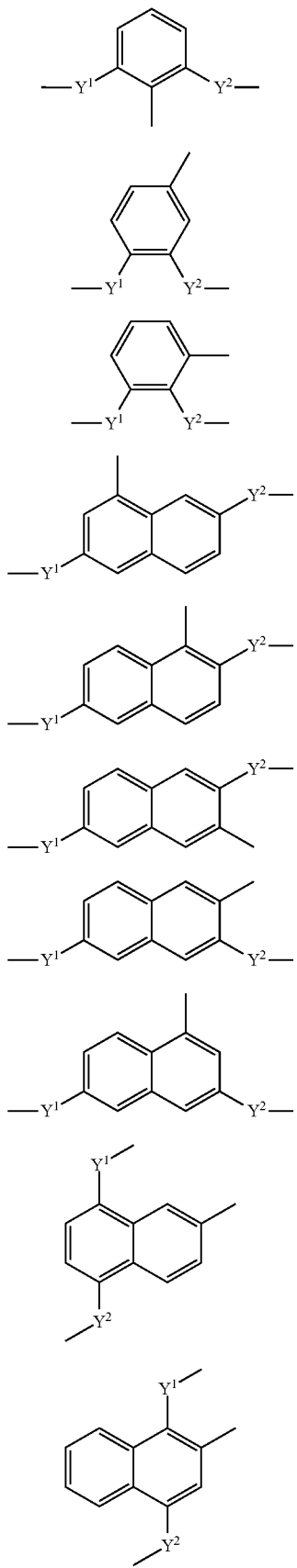

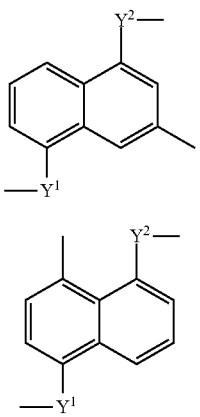

Examples of the substituent that may be included in the trivalent aromatic group of $A^1$ may include those exemplified as the examples of the substituent in the aromatic group of $A^x$ described above. It is preferable that $A^1$ is a trivalent aromatic group having no substituent.

$A^2$ and $A^3$ are each independently a divalent alicyclic hydrocarbon group having 3 to 30 carbon atoms and optionally having a substituent.

Examples of the divalent alicyclic hydrocarbon group having 3 to 30 carbon atoms may include a cycloalkanediyl group having 3 to 30 carbon atoms and a divalent alicyclic fused ring group having 10 to 30 carbon atoms.

Examples of the cycloalkanediyl group having 3 to 30 carbon atoms may include a cyclopropanediyl group; a cyclobutanediyl group, such as a cyclobutane-1,2-diyl group and a cyclobutane-1,3-diyl group; a cyclopentanediyl group, such as a cyclopentane-1,2-diyl group and a cyclopentane-1,3-diyl group; a cyclohexanediyl group, such as a cyclohexane-1,2-diyl group, a cyclohexane-1,3-diyl group, and a cyclohexane-1,4-diyl group; a cycloheptanediyl group, such as a cycloheptane-1,2-diyl group, a cycloheptane-1,3-diyl group, and a cycloheptane-1,4-diyl group; a cyclooctanediyl group, such as a cyclooctane-1,2-diyl group, a cyclooctane-1,3-diyl group, a cyclooctane-1,4-diyl group, and a cyclooctane-1,5-diyl group; a cyclodecanediyl group, such as a cyclodecane-1,2-diyl group, a cyclodecane-1,3-diyl group, a cyclodecane-1,4-diyl group, and a cyclodecane-1,5-diyl group; a cyclododecanediyl group, such as a cyclododecane-1,2-diyl group, a cyclododecane-1,3-diyl group, a cyclododecane-1,4-diyl group, and a cyclododecane-1,5-diyl group; a cyclotetradecanediyl group, such as a cyclotetradecane-1,2-diyl group, a cyclotetradecane-1,3-diyl group, a cyclotetradecane-1,4-diyl group, a cyclotetradecane-1,5-diyl group, and a cyclotetradecane-1,7-diyl group; and a cycloeicosanediyl group, such as a cycloeicosane-1,2-diyl group and a cycloeicosane-1,10-diyl group.

Examples of the divalent alicyclic fused ring group having 10 to 30 carbon atoms may include a decalindiyl group, such as a decalin-2,5-diyl group and a decalin-2,7-diyl group; an adamantanediyl group, such as an adamantane-1,2-diyl group and an adamantane-1,3-diyl group; and a bicyclo[2.2.1]heptanediyl group, such as a bicyclo[2.2.1]heptane-2,3-diyl group, a bicyclo[2.2.1]heptane-2,5-diyl group, and a bicyclo[2.2.1]heptane-2,6-diyl group.

The divalent alicyclic hydrocarbon groups may further have a substituent at any position. Examples of the substituent may include those exemplified as the examples of the substituent in the aromatic group of $A^x$ described above.

Among these, $A^2$ and $A^3$ are preferably a divalent alicyclic hydrocarbon group having 3 to 12 carbon atoms, more preferably a cycloalkanediyl group having 3 to 12 carbon atoms, further preferably a group represented by each of the following formulae (A31) to (A34):

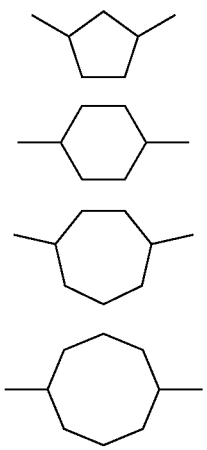

(A31)
(A32)
(A33)
(A34)

and particularly preferably the group represented by the aforementioned formula (A32).

The divalent alicyclic hydrocarbon group having 3 to 30 carbon atoms may exist in forms of cis- and trans-stereoisomers that are on the basis of difference of steric configuration of carbon atoms bonded to $Y^1$ and $Y^3$ (or $Y^2$ and $Y^4$). For example, when the group is a cyclohexane-1,4-diyl group, a cis-isomer (A32a) and a trans-isomer (A32b) may exist, as described below.

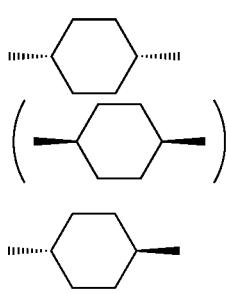

(A32a)

(A32b)

In the present invention, the group may be a cis-isomer, a trans-isomer, or an isomeric mixture of cis- and trans-isomers. The group is preferably the trans-isomer or the cis-isomer, and more preferably the trans-isomer since orientation ability is favorable.

$A^4$ and $A^5$ are each independently a divalent aromatic group having 6 to 30 carbon atoms and optionally having a substituent.

The aromatic group of $A^4$ and $A^5$ may be monocyclic or polycyclic.

Specific preferable examples of $A^4$ and $A^5$ are as follows.

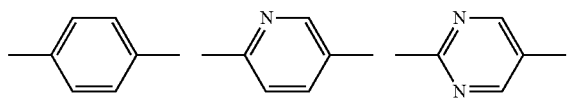

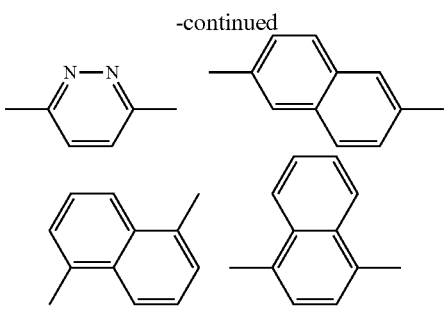

-continued

The divalent aromatic groups of $A^4$ and $A^5$ described above may have a substituent at any position. Examples of the substituent may include a halogen atom, a cyano group, a hydroxyl group, an alkyl group having 1 to 6 carbon atoms, an alkoxy group having 1 to 6 carbon atoms, a nitro group, and a —C(═O)—OR$^{8b}$ group. Herein, R$^{8b}$ is an alkyl group having 1 to 6 carbon atoms. Among these, a halogen atom, an alkyl group having 1 to 6 carbon atoms, and an alkoxy group are preferable. Of the halogen atoms, a fluorine atom is more preferable, of the alkyl groups having 1 to 6 carbon atoms, a methyl group, an ethyl group, and a propyl group are more preferable, and of the alkoxy groups, a methoxy group and an ethoxy group are more preferable.

Among these, from the viewpoint of favorably obtaining the desired effect of the present invention, it is preferable that $A^4$ and $A^5$ are each independently a group represented by the following formula (A41), (A42), or (A43) and optionally having a substituent, and particularly preferable that those are the group represented by the formula (A41) and optionally having a substituent.

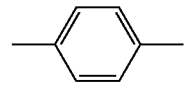

(A41)

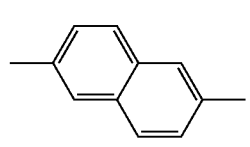

(A42)

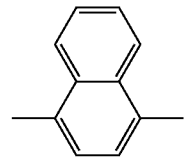

(A43)

$Q^1$ is a hydrogen atom or an alkyl group having 1 to 6 carbon atoms and optionally having a substituent.

Examples of the alkyl group having 1 to 6 carbon atoms and optionally having a substituent may include those exemplified as the examples of $A^x$ described above.

Among these, $Q^1$ is preferably a hydrogen atom or an alkyl group having 1 to 6 carbon atoms, and more preferably a hydrogen atom or a methyl group.

The compound (I) may be produced by a reaction of a hydrazine compound with a carbonyl compound, described in, for example, International publication No. WO2012/147904.

[1.4.3. Polymerizable Monomer]

The composition (A) may contain a polymerizable monomer as an optional component. Herein, the "polymerizable monomer" represents, among compounds that have polymerization ability and can act as a monomer, in particular, the compound other than the polymerizable liquid crystal compound having inverse wavelength dispersion.

As the polymerizable monomer, for example, a compound having one or more polymerizable groups per one molecule may be used. When the polymerizable monomer has such a polymerizable group, polymerization can be achieved in formation of the optically anisotropic layer. When the polymerizable monomer is a crosslinkable monomer having two or more polymerizable groups per molecule, crosslinking polymerization can be achieved. Examples of the polymerizable groups may include groups that are the same as the groups of $Z^1$—$Y^7$— and $Z^2$—$Y^8$— in the compound (I). More specific examples thereof may include an acryloyl group, a methacryloyl group, and an epoxy group.

The polymerizable monomer itself may have liquid crystallinity or non-liquid crystallinity. Herein, that the polymerizable monomer itself has "non-liquid crystallinity" means that even when the polymerizable monomer itself is left at any temperature of room temperature to 200° C., the monomer does not exhibit orientation on the first substrate that has been subjected to an orientation treatment. The presence or absence of orientation is determined by whether light-dark contrast appears during rotation of the rubbing direction in the face in crossed Nicol transmission observation with a polarized light microscope.

The content ratio of the polymerizable monomer in the composition (A) is usually 1 to 100 parts by weight, and preferably 5 to 50 parts by weight, relative to 100 parts by weight of the polymerizable liquid crystal compound having inverse wavelength dispersion. When the content ratio of the polymerizable monomer is appropriately adjusted within the aforementioned range so as to exhibit desired inverse wavelength dispersion, the inverse wavelength dispersion is easily controlled with precision.

The polymerizable monomer may be produced by a known production method. When the polymerizable monomer has a structure similar to the compound (I), the polymerizable monomer may be produced on the basis of the method for producing the compound (I).

[1.4.4. Other Component in Composition (A)]

If necessary, the composition (A) may contain an optional component, such as those exemplified below, in addition to the polymerizable liquid crystal compound and the polymerizable monomer.

The composition (A) may contain a polymerization initiator. The polymerization initiator may be appropriately selected in accordance with the types of polymerizable groups of the polymerizable liquid crystal compound, the polymerizable monomer, and other polymerizable compounds in the composition (A). For example, when the polymerizable group has radical polymerizability, a radical polymerization initiator may be used. When the polymerizable group is an anionic polymerizable group, an anionic polymerization initiator may be used. When the polymerizable group is a cationic polymerizable group, a cationic polymerization initiator may be used.

As the radical polymerization initiator, any of a thermal radical generator that is a compound that generates active species capable of initiating polymerization of the polymerizable compound by heating; and a photo-radical generator that is a compound that generates active species capable of initiating polymerization of the polymerizable compound by exposure to expose light, such as visible light, ultraviolet light (i-line, etc.), far-ultraviolet light, electron beam, and X-ray may be used. The photo-radical generator is suitably used.

Examples of the photo-radical generator may include an acetophenone-based compound, a biimidazole-based compound, a triazine-based compound, an O-acyl oxime-based compound, an onium salt-based compound, a benzoin-based compound, a benzophenone-based compound, an α-diketone-based compound, a polynuclear quinone-based compound, a xanthone-based compound, a diazo-based compound, and an imide sulfonate-based compound, which are described in International publication No. WO2012/147904.

Examples of the anionic polymerization initiator may include an alkyl lithium compound; a monolithium salt or a monosodium salt of biphenyl, naphthalene, and pyrene; and a polyfunctional initiator, such as a dilithium salt and a trilithium salt.

Examples of the cationic polymerization initiator may include a protonic acid, such as sulfuric acid, phosphoric acid, perchloric acid, and trifluoromethanesulfonic acid; a Lewis acid, such as boron trifluoride, aluminum chloride, titanium tetrachloride, and tin tetrachloride; an aromatic onium salt, and a combination of an aromatic onium salt with a reductant.

One type of the polymerization initiator may be used alone, or two or more types thereof may be used in combination.

The content ratio of the polymerization initiator in the composition (A) is usually 0.1 to 30 parts by weight, and preferably 0.5 to 10 parts by weight, relative to 100 parts by weight of the polymerizable compound.

The composition (A) may contain a surfactant for adjustment of surface tension. Although the surfactant is not particularly limited, a nonionic surfactant is usually preferable. As the nonionic surfactant, a commercially available product may be used. For example, a nonionic surfactant that is an oligomer having a molecular weight of several thousands may be used. Specifically, as the surfactant, PolyFox "PF-151N", "PF-636", "PF-6320", "PF-656", "PF-6520", "PF-3320", "PF-651", or "PF-652" available from OMNOVA Solutions Inc.; FTERGENT "FTX-209F", "FTX-208G", or "FTX-204D" available from NEOS COMPANY LIMITED; or SURFLON "KH-40" or "S-420" available from Seimi Chemical Co., Ltd., may be used. As the surfactant, one type thereof may be solely used, and two or more types thereof may also be used in combination at any ratio. The content ratio of the surfactant in the composition (A) is usually 0.01 to 10 parts by weight, and preferably 0.1 to 2 parts by weight, relative to 100 parts by weight of the polymerizable compound.

The composition (A) may contain a solvent, such as an organic solvent. Examples of the organic solvent may include ketones, such as cyclopentanone, cyclohexanone, methyl ethyl ketone, acetone, and methyl isobutyl ketone; acetic acid esters, such as butyl acetate and amyl acetate; halogenated hydrocarbons, such as chloroform, dichloromethane, and dichloroethane; ethers, such as 1,4-dioxane, cyclopentyl methyl ether, tetrahydrofuran, tetrahydropyran, 1,3-dioxolane, and 1,2-dimethoxyethane; and an aromatic hydrocarbon, such as toluene, xylene, and mesitylene. The boiling point of the solvent is preferably 60 to 250° C., and more preferably 60 to 150° C. from the viewpoint of excellent handleability. The amount of the solvent used is usually 100 to 1,000 parts by weight relative to 100 parts by weight of the polymerizable compound.

The composition (A) may further contain an optional additive, such as a metal, a metal complex, a dye, a pigment, a fluorescent material, a phosphorescent material, a leveling agent, a thixotropic agent, a gelator, a polysaccharide, an ultraviolet ray absorber, an infrared ray absorber, an antioxidant, an ion exchange resin, and a metal oxide, such as titanium oxide. The content ratio of an optional additive in the polymerizable composition of the present invention is usually 0.1 to 20 parts by weight relative to 100 parts by weight of the polymerizable compound.

The composition (A) may be usually prepared by mixing the components described above.

[2. Optically Anisotropic Layered Body]

The optically anisotropic layered body of the present invention is obtained by separating the optically anisotropic layer from the multilayer film of the present invention and bonding the optically anisotropic layer to a second long-length substrate.

One example of the second substrate is a film capable of protecting the optically anisotropic layer, such as a masking film. As the masking film, a known film (for example, FF1025 and "FF1035" available from Tredegar Corporation; "SAT116T", "SAT2038T-JSL", and "SAT4538T-JSL" available from Sun A. Kaken Co., Ltd.; "NBO-0424", "TFB-K001", "TFB-K0421", and "TFB-K202" available from FUJIMORI KOGYO CO., LTD.; "DT-2200-25" and "K-6040" available from Hitachi Chemical Co., Ltd.; and "6010#75", "6010#100", "6011#75", and "6093#75" available from Teraoka Seisakusho Co., Ltd.) may be used. From the optically anisotropic layered body having such a second substrate, the optically anisotropic layer can be easily transferred to another member. Therefore, an optical element having the optically anisotropic layer can be easily manufactured.

Another example of the second substrate is a substrate film having optical isotropy. Optical isotropy specifically refers to that the in-plane retardation Re thereof is preferably less than 10 nm, and more preferably less than 5 nm. In an optically isotropic substrate, the retardation Rth in a thickness direction is also preferably less than 10 nm, and more preferably less than 5 nm. The lower limit of the in-plane retardation Re may be 0 nm. The lower limit of the retardation Rth in the thickness direction is preferably more than −10 nm, and more preferably more than −5 nm.

Examples of a material for the optical isotropic substrate film may include a cellulose ester in addition to those exemplified as the examples of the first substrate film described above. A long-length film of such a material may be formed, and the long-length film may be used as it is without stretching as the second substrate. The optically anisotropic layered body having the optically isotropic substrate film as the second substrate is incorporated, as it is, into an optical device such as a display device, and may be used as an optical member.

In manufacturing of the optically anisotropic layered body of the present invention, the step of separating the optically anisotropic layer from the multilayer film and bonding the optically anisotropic layer to the second long-length substrate may be performed by a roll-to-roll operation.

[3. Circularly Polarizing Plate]

The circularly polarizing plate of the present invention is obtained by bonding one or more layers of the optically anisotropic layer to a long-length linear polarizer by a roll-to-roll process.

Specific aspects of the circularly polarizing plate of the present invention may include the following two aspects.

Circularly polarizing plate (i): a circularly polarizing plate obtained by bonding the optically anisotropic layer to a long-length linear polarizer by a roll-to-roll process, wherein the optically anisotropic layer is a layer separated from the multilayer film of the present invention.

Circularly polarizing plate (ii): a circularly polarizing plate obtained by bonding a long-length λ/4 wave plate, a long-length λ/2 wave plate, and a long-length linear polarizer by a roll-to-roll process, wherein the long-length λ/4 wave plate, the long-length λ/2 wave plate, or both the wave plates are the optically anisotropic layer separated from the multilayer film of the present invention.

As the optically anisotropic layer contained in the circularly polarizing plate of the present invention, the optically anisotropic layer separated from the multilayer film of the present invention may directly be used. As the optically anisotropic layer contained in the circularly polarizing plate of the present invention, the optically anisotropic layer that is separated from the multilayer film of the present invention and bonded to the second substrate to form the optically anisotropic layered body of the present invention may be used as it is, or the optically anisotropic layer that is further separated from the optically anisotropic layered body may also be used.

Any of a step of separating the optically anisotropic layer from the multilayer film and a step of bonding the optically anisotropic layer to another layer (another optically anisotropic layer, linear polarizer, etc.) may be first performed. For example, the separating step and the bonding step may be performed by bonding a face of the multilayer film on an optically anisotropic layer side to a face of the linear polarizer and then separating the first substrate.

In the circularly polarizing plate (ii), the relationship of the slow axis of the λ/4 wave plate, the slow axis of the λ/2 wave plate, and the transmission axis of the linear polarizer may be any of various known relationship. For example, when the optically anisotropic layer of the multilayer film of the present invention is used for both the λ/4 wave plate and the λ/2 wave plate, a relationship in which the angle of the direction of the slow axis of the λ/2 wave plate relative to the direction of transmission axis or absorption axis of the polarizer is 15° or an angle close to 15° (for example, 15°±5°, preferably 15°±4°, and more preferably 15°±3°) and the angle of the direction of the slow axis of the λ/4 wave plate relative to the direction of transmission axis or absorption axis of the polarizer is 75° or an angle close to 75° (for example, 75°±5°, preferably 75°±4°, and more preferably 75°±3°) may be established. According to such an aspect, the circularly polarizing plate may be used as a broadband anti-reflective film for an organic EL display device.

In a product according to the present invention (multilayer film, circularly polarizing plate, display device, etc.), a relationship of angle formed between a direction of an in-plane optical axis (slow axis, transmission axis, absorption axis, etc.) and a geometric direction (the lengthwise and widthwise directions of the film, etc.) is defined wherein the shift in a certain direction is positive, and a shift in another direction is negative. The positive and negative directions are commonly defined in components of the relevant product. For example, in a circularly polarizing plate, "the direction of the slow axis of the λ/2 wave plate relative to the direction of transmission axis or absorption axis of the linear polarizer is 15° and the direction of the slow axis of the λ/4 wave plate relative to the direction of transmission axis or absorption axis of the linear polarizer is 75°" represents the following two cases:

When the circularly polarizing plate is observed from one face thereof, the direction of the slow axis of the λ/2 wave plate shifts clockwise by 15° from the direction of transmission axis or absorption axis of the linear polarizer and the direction of the slow axis of the λ/4 wave plate shifts clockwise by 75° from the direction of transmission axis or absorption axis of the linear polarizer.

When the circularly polarizing plate is observed from one face thereof, the direction of the slow axis of the λ/2 wave plate shifts counterclockwise by 15° from the direction of transmission axis or absorption axis of the linear polarizer and the direction of the slow axis of the λ/4 wave plate shifts counterclockwise by 75° from the direction of transmission axis or absorption axis of the linear polarizer.

A specific aspect of the circularly polarizing plate (i) may be an aspect in which the circularly polarizing plate has one layer of λ/4 wave plate as an optically anisotropic layer and the angle of the direction of the slow axis of the λ/4 wave plate relative to the transmission axis or absorption axis of the linear polarizer is 45° or an angle close to 45° (for example, 45°±5°, preferably 45°±4°, and more preferably 45°±3°). According to such an aspect, the circularly polarizing plate can be used as an anti-reflective film for an organic EL display device.

Bonding by a roll-to-roll process is bonding in a manner wherein a film is continuously supplied by feeding it out from a roll of long-length film, the film is conveyed, a step of bonding the film to another film on a conveyance line is performed, and then the bonded product is wound into a take-up roll. For example, when the linear polarizer and the multilayer film are bonded, the multilayer film is fed out from a roll of long-length multilayer film, the film is conveyed, a step of bonding the film to the linear polarizer on a conveyance line is performed, and then the bonded product is wound into a take-up roll, whereby bonding by a roll-to-roll process can be performed. In this case, the linear polarizer may also be supplied to the bonding step by feeding out from a roll.

An example of bonding by a roll-to-roll process will be described with reference to FIG. 1. In FIG. 1, a multilayer film 21 fed out from a feeding roll (not shown) is conveyed to a bonding device 120. The bonding device 120 has nip rollers 121 and 122 that are provided so as to be pressed against each other. The multilayer film 21 conveyed to the bonding device 120 is sent between the nip rollers 121 and 122.

To the bonding device 120, a linear polarizer 30 is also supplied. The supplied linear polarizer 30 is sent between the nip rollers 121 and 122 and bonded to the multilayer film 21. Thus, a bonded product 10 including the multilayer film 21 and the linear polarizer 30 is obtained.

The thus obtained bonded product 10 is conveyed to a winding core 130 and wound into a roll by the winding core 130. Thus, a roll 11 of the bonded product 10 is obtained. When a step of drawing the bonded product from the roll of the bonded product 10 and separating the first substrate is performed, the circularly polarizing plate in which the optically anisotropic layer and the linear polarizer are bonded by a roll-to-roll process can be obtained.

As the linear polarizer, a known polarizer used for a device, such as a liquid crystal display device and another optical device, may be used. Examples of the linear polarizer may include a linear polarizer obtained by adsorbing iodine or a dichroic dye to a polyvinyl alcohol film and then uniaxially stretching the film in a boric acid bath, and a linear polarizer obtained by adsorbing iodine or a dichroic dye to a polyvinyl alcohol film, then stretching the film, and then further modifying a part of a polyvinyl alcohol unit in the molecular chain into a polyvinylene unit. Other examples of the linear polarizer may include a polarizer having a function of separating polarized light into reflected light and transmitted light, such as a grid polarizer, a multilayer polarizer, and a cholesteric liquid crystal polarizer. Among these, a polarizer containing polyvinyl alcohol is preferable.

When natural light is made incident on a polarizer used in the present invention, only one polarized light is transmitted. Although the degree of polarization of the polarizer used in the present invention is not particularly limited, the degree is preferably 98% or more, and more preferably 99% or more. The average thickness of the polarizer is preferably 5 to 80 μm.

One of applications of the circularly polarizing plate of the present invention may be an application of anti-reflective film for a display device having an organic EL element. That is, the circularly polarizing plate having the aforementioned configuration is provided on a surface of the display device so that a face on a linear polarizer side is disposed toward a visual recognition side. This can suppress reflection in the device of incident light that has entered from the outside of the display device, and emission of the light to the outside of the display device. As a result, undesired phenomena such as glare on a display face of the display device can be suppressed. Specifically, among the light that has entered from the outside of the display device, only a part of linearly polarized light passes through the linear polarizer. The light then passes through the optically anisotropic layer to be converted into circularly polarized light. The circularly polarized light herein includes elliptically polarized light as long as an anti-reflection function is substantially expressed. The circularly polarized light is reflected on a component that reflects light in the display device (reflection electrode in the organic EL element, etc.), and then passes again through the optically anisotropic layer, resulting in linearly polarized light having a polarization axis in a direction orthogonal to the polarization axis of the linear polarized light that has entered. Thus, the light does not pass through the liner polarizer. Accordingly, the anti-reflection function can be achieved. In particular, according to the circularly polarizing plate (ii) described above, the anti-reflection function at a wider region can be achieved. Since the circularly polarizing plate of the present invention has a reduced number of defects due to a foreign substance or the like in the optically anisotropic layer, the effect of anti-reflection can be particularly favorably obtained. For example, an optically anisotropic layer having a relationship of three-dimensional refractive indexes ($nx$, $ny$, and $nz$) that satisfies "$nx>ny=nz$", "$nx>ny>nz$", "$nx>nz>ny$", and the like, may be used. When an optically anisotropic layer having a relationship of three-dimensional refractive index of "$nx>nz>ny$" is used, not only an anti-reflection function in a frontal direction but also an anti-reflection function in a diagonal direction can be obtained.

The circularly polarizing plate of the present invention may have another optional layer, if necessary. Examples of the optional layer may include an adhesion layer for adhesion to another member, a mat layer for improving sliding properties of the film, a hard-coat layer, such as an impact-resistant polymethacrylate resin layer, an anti-reflection layer, and an anti-fouling layer.

[4. Display Device]

The circularly polarizing plate of the present invention may be used as a component of a display device, such as a liquid crystal display and an organic EL display device. As a particularly preferable aspect, the organic EL display device of the present invention includes the circularly polarizing plate of the present invention. Specifically, the organic EL display device of the present invention is a display device having an organic EL element as a display element in which the circularly polarizing plate of the present invention may be provided as the anti-reflective film, as described above.

EXAMPLES

Hereinafter, the present invention will be specifically described with reference to Examples. However, the present invention is not limited to Examples described below. The present invention may be freely modified and practiced without departing from the scope of claims of the present invention and the scope of their equivalents.

Unless otherwise specified, "%" and "part(s)" that represent an amount in the following description are on the basis of weight. Unless otherwise specified, operations described below were performed under conditions of normal temperature and normal pressure.

[Evaluation Method]
[Measurement of Slow Axis Direction and Orientation Angle Variation of First Substrate and Intermediate Film]

Orientation angles were measured at intervals of 50 mm in a widthwise direction of a film by a polarized light microscope (polarized light microscope BX51 manufactured by Olympus Corporation). The average of the orientation angles was taken as an average orientation angle (i.e., angle of a slow axis direction relative to the widthwise direction). The difference between maximum and minimum values of the orientation angles was taken as orientation angle variation.

[Measurement of Re of First Substrate and Intermediate Film and Nz Factor of First Substrate]

Re's and Nz factors at 590 nm were measured at intervals of 50 mm in the widthwise direction of the film by a phase difference meter (AxoScan manufactured by Axometrics, Inc.). The averages of the Re's and Nz factors were taken as Re and Nz factor, respectively.

[Measurement of Re and Slow Axis Direction of Optically Anisotropic Layer]

For a sample obtained by transferring an optically anisotropic layer to a glass plate, measurement was performed at a measurement wavelength of 590 nm by AxoScan (manufactured by Axometrics, Inc.).

[Evaluation of Orientation State]

A sample obtained by transferring an optically anisotropic layer to a glass plate was manufactured, and disposed between two linear polarizers (polarizer and analyzer). At that time, the linear polarizers were disposed so that polarized light transmission axes of the polarizers were perpendicular to each other as viewed in a thickness direction. The slow axis direction of the optically anisotropic layer was set so as to be parallel or perpendicular to the polarized light transmission axes of the linear polarizers as viewed in the thickness direction. The transmittance of light passing through this sample (crossed Nicol transmittance) was measured by a spectrophotometer "V7200" and an automated polarizing film measurement device "VAP-7070S" manufactured by JASCO Corporation, and evaluated in accordance with the following criteria.

Excellent: the crossed Nicol transmittance at the bottom wavelength was 0.010% or less.

Good: the crossed Nicol transmittance at the bottom wavelength was more than 0.010% and 0.020% or less.

Passable: the crossed Nicol transmittance at the bottom wavelength was more than 0.020% and 0.030% or less.

Bad: the crossed Nicol transmittance at the bottom wavelength was more than 0.030%.

[Evaluation of Orientation Defects]

The same sample as one used in the evaluation of orientation state was cut into a 10-cm square, and the number of schlieren defects was counted using a polarized light microscope. The orientation defect was evaluated by the number of schlieren defects in a 1-cm square of the sample in the following three stages.

A: the number of schlieren defects in a 1-cm square was 10 or less.

B: the number of schlieren defects in a 1-cm square was 11 or more and 20 or less.

C: the number of schlieren defects in a 1-cm square was 21 or more.

[Evaluation of Bright Spot and Foreign Substance]

The optically anisotropic layer was observed by a polarized light microscope. The numbers of bright spots and foreign substances in the optically anisotropic layer were counted, and evaluated by the numbers of bright spots and foreign substances in a 1-cm square of the sample in the following four stages.

SA: the number of bright spots in a 1-cm square was 0.

A: the number of bright spots in a 1-cm square was 1 or more and 5 or less.

B: the number of bright spots in a 1-cm square was 6 or more and 15 or less.

C: the number of bright spots in a 1-cm square was 16 or more.

[Visual Observation of Circularly Polarizing Plate]

The circularly polarizing plate was placed on a diffuse reflection plate (trade name: "Metalumy TS50" available from Toray Industries, Inc., aluminum metallized PET (polyethylene terephthalate) film), and front contrast and viewing angle characteristics were evaluated in accordance with the following criteria.

The front contrast was visually observed from the front (that is, in a direction perpendicular to a face of the circularly polarizing plate) and evaluated on the basis of observed reflection color. The case where the reflection color was particularly black was evaluated as "A" (excellent). The case where the reflection color was black was evaluated as "B" (good). The case where the reflection color was bright and blue was evaluated as "C" (bad).

The viewing angle characteristics were visually observed from the front and at an angle of 45° and evaluated on the basis of reflection color, brightness, and color unevenness.

The case where the reflection color and the brightness observed from the front were not different from those observed at an angle of 45° and the color unevenness observed at an angle of 45° was not recognized was evaluated as "A" (excellent).

The case where the reflection color and the brightness observed from the front were not different from those observed at an angle of 45° and the color unevenness observed at an angle of 45° was not almost recognized was evaluated as "B" (good).

The case where the reflection color and the brightness observed from the front were different from those observed at an angle of 45° and the color unevenness observed at an angle of 45° was slightly recognized was evaluated as "C" (usable but not good).

The case where the reflection color and the brightness observed from the front were different from those observed at an angle of 45° and the color unevenness observed at an angle of 45° was clearly recognized was evaluated as "D" (bad).

Production Example 1: Preparation of Pre-Stretch Substrate (A)

Pellets of a thermoplastic norbornene resin (trade name "ZEONOR1420R" available from ZEON Corporation, Tg: 137° C.) were dried at 100° C. for 5 hours. The dried pellets were supplied to an extruder, melted in the extruder, passed through a polymer pipe and a polymer filter, and extruded from a T-die on a casting drum into a sheet shape. The sheet was cooled, and wound while the sheet was protected with a masking film (FF1025 available from Tredegar Corporation). As a result, a roll of a pre-stretch substrate (A) having a thickness of 100 μm and a width of 1,490 mm was obtained.

Production Example 2: Preparation of Pre-Stretch Substrate (B)

A roll of a pre-stretch substrate (B) having a thickness of 100 μm and a width of 1,490 mm was obtained in the same manner as in Production Example 1 except that the pellets of the thermoplastic norbornene resin were changed to pellets of another norbornene resin (available from ZEON Corporation, Tg: 126° C.).

Production Example 3: Preparation of Pre-Stretch Substrate (C)

A roll of a pre-stretch substrate (C) having a thickness of 60 μm and a width of 1,350 mm was obtained in the same manner as in Production Example 1 except that the pellets of the thermoplastic norbornene resin were changed to pellets of another norbornene resin (available from ZEON Corporation, Tg: 126° C.) and the T-die was changed.

Production Example 4: Preparation of Pre-Stretch Substrate (D)

A roll of a pre-stretch substrate (D) having a thickness of 90 μm and a width of 1,060 mm was obtained in the same manner as in Production Example 1 except that the pellets of the thermoplastic norbornene resin were changed to pellets of another norbornene resin (available from ZEON Corporation, Tg: 126° C.) and the T-die was changed.

Production Example 5: Preparation of Liquid Crystal Composition (A)

24.15 Parts of a polymerizable liquid crystal compound (trade name "LC242" available from BASF, a compound represented by a formula (A1)), 0.12 parts of a surfactant (trade name "FTERGENT FTX-209F" available from NEOS COMPANY LIMITED), 0.73 parts by weight of a polymerization initiator (trade name "IRGACURE 379" available from BASF), and 75.00 parts of a solvent (methyl ethyl ketone) were mixed to prepare a liquid crystal composition.

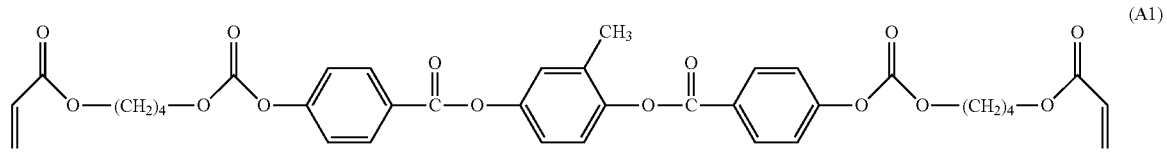

(A1)

Production Example 6: Preparation of Liquid Crystal Composition (B)

21.25 Parts of a polymerizable liquid crystal compound having inverse wavelength dispersion represented by a formula (B1), 0.11 parts of a surfactant (trade name "Surflon S420" available from AGC Seimi Chemical Co., Ltd.), 0.64 parts of a polymerization initiator (trade name "IRGACURE 379" available from BASF), and 78.00 parts of a solvent (cyclopentanone available from ZEON Corporation) were mixed to prepare a liquid crystal composition.

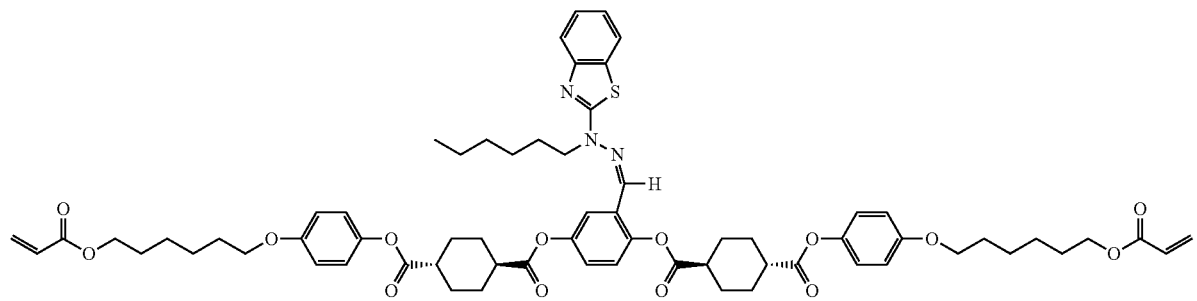

(B1)

Example 1

(1-1. Preparation of First Substrate)

The pre-stretch substrate (A) was drawn from the roll of the pre-stretch substrate (A) obtained in Production Example 1, the masking film was continuously separated, and the pre-stretch substrate (A) was supplied to a tenter stretching machine. The pre-stretch substrate was diagonally stretched, to obtain an intermediate film. In the diagonal stretching, the stretching ratio was 1.9 times, and the stretching temperature was 132° C. In the obtained intermediate film, the average orientation angle relative to the widthwise direction was 25°, and the Re was 360 nm.

The obtained intermediate film was further stretched by free longitudinal uniaxial stretching. The stretching direction of the free longitudinal uniaxial stretching was a film conveyance direction, the stretching ratio was 1.25 times, and the stretching temperature was 129° C.

After the stretching, both ends of the substrate film in the widthwise direction were trimmed to obtain a first long-length substrate (A-1) having a width of 1,350 mm. The slow axis of the resultant stretched substrate was 45° relative to the widthwise direction, the variation of orientation angle was 0.5°, the Nz factor was 2.3, the Re was 141 nm, and the thickness was 42 μm.

The obtained first substrate (A-1) was wound while the first substrate was protected with a new masking film (FF1025 available from Tredegar Corporation). Thus, a roll of the first substrate (A-1) was obtained.

(1-2. Formation of Layer of Liquid Crystal Composition)

The first substrate (A-1) was fed out from the roll of the first substrate (A-1) obtained in (1-1), the masking film was separated, and the first substrate was conveyed. The liquid crystal composition (A) obtained in Production Example 5 was applied directly onto one face of the conveyed first substrate (A-1) (face on a side that had been bonded to the masking film) by a die coater at a room temperature of 25° C. to form a layer of the liquid crystal composition.

The application by the die coater was performed by setting a secured discharging port of the die coater in a proximity of a surface of the conveyed first substrate (A-1) and discharging the liquid crystal composition (A) from the die coater. As a result, the applying direction relative to the surface of the conveyed first substrate (A-1) by the die coater was a lengthwise direction (i.e., 90° relative to the widthwise direction).

(1-3. Orientation Treatment and Polymerization)

The layer of the liquid crystal composition on the first substrate (A-1), obtained in (1-2), was subjected to an orientation treatment at 110° C. for 2.5 minutes. The layer of the liquid crystal composition was then irradiated with ultraviolet light having an integrated light amount of 100 mJ/cm$^2$ (irradiation intensity of 10 mW/cm$^2$ for an irradiation time of 10 seconds) or more under a nitrogen atmosphere to polymerize the polymerizable liquid crystal compound in the liquid crystal composition. Thus, cured liquid crystal molecules were formed. As a result, an optically anisotropic layer that was homogeneously oriented and had a dried thickness of 1.1 μm was obtained, and a multilayer film having a layer configuration of (first substrate)/(optically anisotropic layer) was obtained.

(1-4. Evaluation)

The in-plane retardation and the angle formed between the slow axis and the widthwise direction in the optically anisotropic layer of the obtained multilayer film were measured, and the orientation state, the orientation defects, as well as a bright spot and a foreign substance were evaluated.

Example 2

A first substrate and a multilayer film were obtained and evaluated by the same operation as in Example 1 except for the following matters:

In the step of diagonally stretching the pre-stretch substrate (A) in (1-1) to form an intermediate film, the stretching temperature was changed to 133° C. and the stretching direction was changed (stretching ratio was 1.9 times which was not changed). The obtained intermediate film had an average orientation angle of 23° and an Re of 325 nm (the upper limit of the subsequent free longitudinal uniaxial stretching was not changed).

The dried thickness of the optically anisotropic layer was changed to 2.2 μm in (1-3).

Example 3

A first substrate and a multilayer film were obtained and evaluated by the same operation as in Example 1 except for the following matters:

In the step of diagonally stretching the pre-stretch substrate (A) in (1-1) to form an intermediate film, the stretching ratio was changed to 2.0 times, the stretching temperature was changed to 136° C., and the stretching direction was changed. The obtained intermediate film had an average orientation angle relative to the widthwise direction of 30° and an Re of 450 nm.

In the step of stretching the intermediate film in (1-1) by free longitudinal uniaxial stretching, the stretching ratio was changed to 1.20 times, and the stretching temperature was changed to 132° C.

Example 4

A first substrate and a multilayer film were obtained and evaluated by the same operation as in Example 1 except for the following matters:

In the step of diagonally stretching the pre-stretch substrate (A) in (1-1) to form an intermediate film, the stretching ratio was changed to 3.0 times, the stretching temperature was changed to 131° C., and the stretching direction was changed. The obtained intermediate film had an average orientation angle relative to the widthwise direction of 15° and an Re of 300 nm.

In the step of stretching the intermediate film in (1-1) by free longitudinal uniaxial stretching, the stretching ratio was changed to 1.40 times (the stretching temperature was 129° C., which was not changed).

Example 5

(5-1. Preparation of First Substrate)

The pre-stretch substrate (A) was drawn from the roll of the pre-stretch substrate (A) obtained in Production Example 1, and the masking film was continuously separated. The pre-stretch substrate (A) was subjected to free longitudinal uniaxial stretching to thereby obtain an intermediate film. The stretching direction of free longitudinal uniaxial stretching was a film conveyance direction, the stretching ratio was 1.2 times, and the stretching temperature was 140° C. The obtained intermediate film had an average orientation angle relative to the widthwise direction of 90° and an Re of 160 nm.

The obtained intermediate film was further supplied to a tenter stretching machine, and diagonal stretching was performed. The stretching ratio in diagonal stretching was 1.70 times and the stretching temperature was 136° C.

After the stretching, both ends of the substrate film in the widthwise direction were trimmed to obtain a first long-length substrate (A-1) having a width of 1,350 mm. The resultant stretched substrate had a slow axis at 45° relative to the widthwise direction, a variation of orientation angle of 0.3°, an Nz factor of 1.6, an Re of 140 nm, and a thickness of 49 μm.

The obtained first substrate (A-1) was wound while the first substrate was protected with a new masking film (FF1025 available from Tredegar Corporation). Thus, a roll of the first substrate (A-1) was obtained.

(5-2. Manufacturing and Evaluation of Multilayer Film)

A multilayer film was manufactured and evaluated in the same manner as in (1-2) to (1-4) of Example 1 except that the roll obtained in (5-1) was used in place of the roll obtained in (1-1) of Example 1 as the roll of the first substrate (A-1) and the dried thickness of the optically anisotropic layer was changed to 1.5 μm.

Example 6

A first substrate and a multilayer film were obtained and evaluated by the same operation as in Example 1 except for the following matters:
 In the step of diagonally stretching the pre-stretch substrate (A) in (1-1) to form an intermediate film, the stretching ratio was changed to 1.25 times, the stretching temperature was changed to 135° C., and the stretching direction was changed. The obtained intermediate film had an average orientation angle relative to the widthwise direction of 15° and an Re of 140 nm.
 In the step of stretching the intermediate film in (1-1) by free longitudinal uniaxial stretching, the stretching ratio was changed to 1.60 times, and the stretching temperature was changed to 138° C.
 The liquid crystal composition (B) obtained in Production Example 6 was used in place of the liquid crystal composition (A) in (1-2).
 The dried thickness of the optically anisotropic layer was changed to 2.2 μm in (1-3).

Example 7

A first substrate and a multilayer film were obtained and evaluated by the same operation as in Example 1 except for the following matters:
 The roll of the pre-stretch substrate (B) obtained in Production Example 2 was used in place of the roll of the pre-stretch substrate (A) in (1-1).
 In the step of diagonally stretching the pre-stretch substrate (A) in (1-1) to form an intermediate film, the stretching ratio was changed to 1.25 times, the stretching temperature was changed to 135° C., and the stretching direction was changed. The obtained intermediate film had an average orientation angle relative to the widthwise direction of 45° and an Re of 140 nm.
 In the step of stretching the intermediate film in (1-1) by free longitudinal uniaxial stretching, the stretching ratio was changed to 1.40 times, and the stretching temperature was changed to 133° C.
 The dried thickness of the optically anisotropic layer was changed to 1.2 μm in (1-3).

Example 8

(8-1. Preparation of First Substrate)

The pre-stretch substrate (C) was drawn from the roll of the pre-stretch substrate (C) obtained in Production Example 3, the masking film was continuously separated, and the pre-stretch substrate (C) was supplied to a tenter stretching machine, to perform diagonal stretching. The stretching ratio in diagonal stretching was 1.5 times and the stretching temperature was 142° C.

After the stretching, both ends of the substrate film in the widthwise direction were trimmed to obtain a first long-length substrate (A-1) having a width of 1,350 mm. The resultant stretched substrate had a slow axis at 15° relative to the widthwise direction, a variation of orientation angle of 0.7°, an Nz factor of 1.1, an Re of 141 nm, and a thickness of 22 μm.

The obtained first substrate (A-1) was wound while the first substrate was protected with a new masking film (FF1025 available from Tredegar Corporation). Thus, a roll of the first substrate (A-1) was obtained.

(8-2. Manufacturing and Evaluation of Multilayer Film)

A multilayer film was manufactured and evaluated in the same manner as in (1-2) to (1-4) of Example 1 except that the roll obtained in (8-1) was used in place of the roll obtained in (1-1) of Example 1 as the roll of the first substrate (A-1).

Example 9

(9-1. Preparation of First Substrate)

The pre-stretch substrate (D) was drawn from the roll of the pre-stretch substrate (D) obtained in Production Example 4, the masking film was continuously separated, and the pre-stretch substrate (D) was supplied to a tenter stretching machine, to perform diagonal stretching. The stretching ratio in diagonal stretching was 1.96 times and the stretching temperature was 142° C.

After the stretching, both ends of the substrate film in the widthwise direction were trimmed to obtain a first long-length substrate (A-1) having a width of 1,350 mm. The resultant stretched substrate had a slow axis at 22.5° relative to the widthwise direction, a variation of orientation angle of 0.2°, an Nz factor of 1.35, an Re of 259 nm, and a thickness of 43 μm.

The obtained first substrate (A-1) was wound while the first substrate was protected with a new masking film (FF1025 available from Tredegar Corporation). Thus, a roll of the first substrate (A-1) was obtained.

(9-2. Manufacturing and Evaluation of Multilayer Film)

A multilayer film was manufactured and evaluated in the same manner as in (1-2) to (1-4) of Example 1 except that the roll obtained in (9-1) was used in place of the roll obtained in (1-1) of Example 1 as the roll of the first substrate (A-1).

Comparative Example 1

A first substrate and a multilayer film were obtained and evaluated by the same operation as in Example 1 except for the following matters:
 In the step of diagonally stretching the pre-stretch substrate (A) in (1-1) to form an intermediate film, the stretching ratio was changed to 3.0 times, the stretching temperature was changed to 131° C., and the stretching direction was changed. The obtained intermediate film had an average orientation angle relative to the widthwise direction of 15° and an Re of 300 nm.

In the step of stretching the intermediate film in (1-1) by free longitudinal uniaxial stretching, the stretching ratio was changed to 1.80 times, and the stretching temperature was changed to 128° C.

Comparative Example 2

A first substrate and a multilayer film were obtained and evaluated by the same operation as in Example 1 except for the following matters:

In the step of diagonally stretching the pre-stretch substrate (A) in (1-1) to form an intermediate film, the stretching ratio was changed to 1.5 times, the stretching temperature was changed to 144° C., and the stretching direction was changed. The obtained intermediate film had an average orientation angle relative to the widthwise direction of 55° and an Re of 300 nm.

In the step of stretching the intermediate film in (1-1) by free longitudinal uniaxial stretching, the stretching ratio was changed to 2.0 times, and the stretching temperature was changed to 145° C.

The results in Examples 1 to 9 and Comparative Examples 1 and 2 are shown in Tables 1 and 2.

TABLE 1

|  | Ex. 1 | Ex. 2 | Ex. 3 | Ex. 4 | Ex. 5 | Ex. 6 |
|---|---|---|---|---|---|---|
| Substrate type | (A) | (A) | (A) | (A) | (A) | (A) |
| Substrate stretching | Diagonal -> longitudinal | Diagonal -> longitudinal | Diagonal -> longitudinal | Diagonal -> longitudinal | Longitudinal -> diagonal | Diagonal -> longitudinal |
| Substrate slow axis direction | 45° | 45° | 60° | 75° | 45° | 45° |
| Substrate orientation angle variation | 0.5 | 0.4 | 0.4 | 0.7 | 0.3 | 0.3 |
| Substrate Nz factor | 2.3 | 2.1 | 2.0 | 2.9 | 1.6 | 1.1 |
| Substrate Re (nm) | 141 | 141 | 120 | 100 | 140 | 140 |
| Substrate thickness (μm) | 42 | 42 | 42 | 25 | 49 | 50 |
| Liquid crystal type | A | A | A | A | A | B |
| Orientation temperature (° C.) | 110 | 110 | 110 | 110 | 110 | 115 |
| Anisotropic layer Re (nm) | 145 | 270 | 144 | 145 | 142 | 145 |
| Anisotropic layer thickness (μm) | 1.1 | 2.2 | 1.1 | 1.1 | 1.5 | 2.2 |
| Angle between anisotropic layer slow axis and widthwise direction | 45° | 45° | 60° | 75° | 45° | 45° |
| Orientation state | Good | Good | Good | Good | Good | Good |
| Orientation defects | A | A | A | A | A | A |
| Bright spot and foreign substance | A | A | SA | SA | A | A |

TABLE 2

|  | Ex. 7 | Ex. 8 | Ex. 9 | Comp. Ex. 1 | Comp. Ex. 2 |
|---|---|---|---|---|---|
| Substrate type | (B) | (C) | (D) | (A) | (A) |
| Substrate stretching | Diagonal -> longitudinal | Diagonal | Diagonal | Diagonal -> longitudinal | Diagonal -> longitudinal |
| Substrate slow axis direction | 75° | 15° | 22.5° | 75° | 45° |
| Substrate orientation angle variation | 0.3 | 0.7 | 0.2 | 1.2 | 1.3 |
| Substrate Nz factor | 1.1 | 1.1 | 1.35 | 3.1 | 1.4 |
| Substrate Re(nm) | 140 | 141 | 259 | 140 | 142 |
| Substrate thickness (μm) | 57 | 22 | 43 | 25 | 43 |
| Liquid crystal type | A | A | A | A | A |
| Orientation temperature (° C.) | 110 | 110 | 110 | 110 | 110 |
| Anisotropic layer Re(nm) | 148 | 145 | 144 | 145 | 145 |

TABLE 2-continued

|  | Ex. 7 | Ex. 8 | Ex. 9 | Comp. Ex. 1 | Comp. Ex. 2 |
|---|---|---|---|---|---|
| Anisotropic layer thickness (μm) | 1.2 | 1.1 | 1.1 | 1.1 | 1.1 |
| Angle between anisotropic layer slow axis and widthwise direction | 75° | 15° | 22.5° | 75° | 45° |
| Orientation state | Good | Good | Good | Bad | Bad |
| Orientation defects | A | B | B | C | C |
| Bright spot and foreign substance | SA | A | A | B | B |

Example 10

(10-1. Manufacturing of Circularly Polarizing Plate)

A circularly polarizing plate was manufactured using the optically anisotropic layer of the multilayer film obtained in Example 1 as a λ/4 wave plate.

As a long-length linear polarizer, a polarizing film (trade name "HLC2-5618S" available from Sanritz Corporation, thickness: 180 μm, transmission axis at an angle relative to the widthwise direction of 0°) was prepared. One face of the film was bonded to a face of the multilayer film obtained in Example 1 on a side of the optically anisotropic layer (that is, the λ/4 wave plate). The bonding was performed through an adhesive layer (trade name "CS9621" available from Nitto Denko Corporation). Thus, a layered body (10-i) having a layer configuration of (polarizer)/(adhesive layer)/(λ/4 wave plate)/(first substrate) was obtained.

The first substrate was then separated from the layered body (10-i) to obtain a circularly polarizing plate having a layer configuration of (polarizer)/(adhesive layer)/(λ/4 wave plate).

Both the bonding and separation operations were continuously performed by a roll-to-roll process in the manner illustrated in FIG. 1. Therefore, the bonding operation was performed in a state where the lengthwise directions of the long-length films were aligned.

The optical axes of components of the obtained circularly polarizing plate had the following angle relationship. That is, when the circularly polarizing plate was observed from a face on a side of the polarizer, the slow axis of the λ/4 wave plate shifted clockwise by 45° from the direction of transmission axis of the polarizing plate.

(10-2. Evaluation)

The long-length circularly polarizing plate obtained in (10-1) was cut into an appropriate size and visually observed for evaluation.

Examples 11 and 12

A circularly polarizing plate was obtained by the same operation as in (10-1) of Example 10 except that the multilayer film obtained in Example 5 (Example 11) or the multilayer film obtained in Example 6 (Example 12) was used in place of the multilayer film obtained in Example 1.

The angle relationship of optical axes of components of the obtained circularly polarizing plate was the same as that of the circularly polarizing plate obtained in Example 10.

The long-length circularly polarizing plate thus obtained was cut into an appropriate size and visually observed for evaluation.

The evaluation results by visual observation in Examples 10 to 12 are shown in Table 3.

TABLE 3

|  | Ex. 10 | Ex. 11 | Ex. 12 |
|---|---|---|---|
| Example producing the used optically anisotropic layer | Ex. 1 | Ex. 5 | Ex. 6 |
| Front contrast | B | B | A |
| Viewing angle | B | B | B |

Example 13

A face of the circularly polarizing plate manufactured in Example 12 on a side of the λ/4 wave plate was bonded to a reflection face of a reflection plate (trade name: "Metalumy TS50" available from Toray Industries, Inc., aluminum metallized PET (polyethylene terephthalate) film). The bonding was performed through an adhesive layer (trade name "CS9621" available from Nitto Denko Corporation). Thus, a layered body (12-v) for evaluation having a layer configuration of (polarizer)/(adhesive layer)/(λ/4 wave plate)/(adhesive layer)/(reflection plate) was obtained.

For the obtained layered body (12-v) for evaluation, the reflectance of light incident on the face on the polarizer side was measured. In the measurement, a spectrophotometer V7200 and an absolute reflectance unit VAR7020 (manufactured by JASCO Corporation) were used. In the measurement, the polar angle was variously changed within a range of 5° to 60°. When the circularly polarizing plate was observed from the face on the polarizer side, the azimuth angles were set to angles of 0°, 45°, 90°, and 135° clockwise from the direction of transmission axis of the polarizer. The results are shown in FIG. 2.

Figure 2:
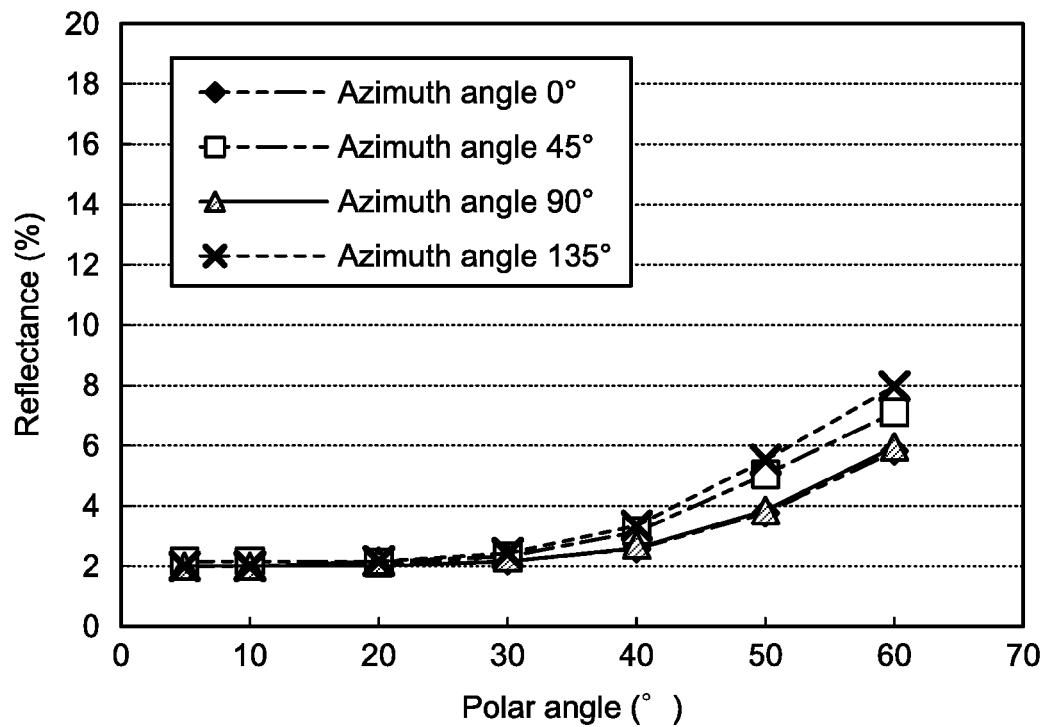
FIG. 2 is a graph showing results of measurement of reflectance of light incident on a surface on a polarizer side of a layered body for evaluation of a circularly polarizing plate and results of calculation of reflection brightness from the measured reflectance in Example 13.

As seen from the results of Tables 1 to 3 and FIG. 2, in Examples of the present application, multilayer films having a reduced number of defects due to generation of a foreign substance and a reduced number of defects due to insufficient orientation-regulating force were successfully manufactured, and circularly polarizing plates having favorable performance were successfully manufactured using the multilayer film.

REFERENCE SIGN LIST

10: bonded product
21: multilayer film
30: linear polarizer
120: bonding device
121: nip roller
122: nip roller
130: winding core

The invention claimed is:
1. A multilayer film comprising:
a first long-length substrate; and
an optically anisotropic layer that is formed directly on the first substrate and contains cured liquid crystal molecules, wherein
the first substrate has an Nz factor of 1.1 to 3.0, variation of orientation angle of 1.0° or less, and an orientation-regulating force caused by stretching, an angle formed between a slow axis of the first substrate and a widthwise direction of the first substrate is 0° or more and less than 90°, and the cured liquid crystal molecules have homogeneous orientation regularity.

2. The multilayer film according to claim 1, wherein the angle formed between the slow axis of the first substrate and the widthwise direction of the first substrate is 40° to 80°.

3. The multilayer film according to claim 2, wherein the angle formed between the slow axis of the first substrate and the widthwise direction of the first substrate is 55° to 80°.

4. The multilayer film according to claim 1, wherein the first substrate is a film of a resin having a positive intrinsic birefringence.

5. The multilayer film according to claim 1, wherein the first substrate is a film of a resin containing an alicyclic structure-containing polymer.

6. The multilayer film according to claim 1, wherein the first substrate is a stretched film obtained by a stretching step including one or more diagonal stretching processes.

7. The multilayer film according to claim 1, wherein the optically anisotropic layer has inverse wavelength dispersion.

8. The multilayer film according to claim 1, wherein the optically anisotropic layer is a λ/4 wave plate.

9. The multilayer film according to claim 1, wherein the optically anisotropic layer is a λ/2 wave plate.

10. The multilayer film according to claim 1, wherein the optically anisotropic layer has a thickness of 5 µm or less.

11. An optically anisotropic layered body obtained by:
   separating, from the multilayer film according to claim 1, the optically anisotropic layer; and
   bonding the optically anisotropic layer to a second long-length substrate.

12. A circularly polarizing plate obtained by bonding an optically anisotropic layer to a long-length linear polarizer by a roll to roll process, wherein
   the optically anisotropic layer is a layer separated from the multilayer film according to claim 1.

13. An organic electroluminescent display device comprising the circularly polarizing plate according to claim 12.

14. A method for manufacturing the multilayer film according to claim 1, the method comprising:
   a step (I) of feeding out a first long-length substrate in a lengthwise direction, in which the first substrate has an Nz factor of 1.1 to 3.0, variation of orientation angle of 1.0° or less, and an orientation-regulating force caused by stretching, and an angle formed between the slow axis of the first substrate and the widthwise direction of the first substrate is 0° or more and less than 90°;
   a step (II) of applying a liquid crystal composition containing a polymerizable liquid crystal compound directly onto a surface of the fed-out first substrate to form a layer of the liquid crystal composition;
   a step (III) of orienting the polymerizable liquid crystal compound in the layer of the liquid crystal composition; and
   a step (IV) of polymerizing the polymerizable liquid crystal compound to form cured liquid crystal molecules, wherein
   the cured liquid crystal molecules have homogeneous orientation regularity.

15. The method for manufacturing the multilayer film according to claim 14, wherein an applying direction of the liquid crystal composition is different from an orientation direction of the polymerizable liquid crystal compound.

* * * * *